(12) United States Patent
Funatsu et al.

(10) Patent No.: US 11,193,974 B2
(45) Date of Patent: Dec. 7, 2021

(54) FAILURE DIAGNOSTIC APPARATUS AND FAILURE DIAGNOSTIC METHOD

(71) Applicant: RENESAS ELECTRONICS CORPORATION, Tokyo (JP)

(72) Inventors: Yukihisa Funatsu, Tokyo (JP); Kazuki Shigeta, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/121,211

(22) Filed: Dec. 14, 2020

(65) Prior Publication Data
US 2021/0255242 A1    Aug. 19, 2021

(30) Foreign Application Priority Data

Feb. 17, 2020    (JP) .............................. JP2020-024177

(51) Int. Cl.
*G01R 31/3177*    (2006.01)
*G01R 31/3181*    (2006.01)
(Continued)

(52) U.S. Cl.
CPC ..... *G01R 31/3177* (2013.01); *G01R 31/3181* (2013.01); *G01R 31/3183* (2013.01);
(Continued)

(58) Field of Classification Search
CPC ............ G01R 31/3177; G01R 31/3181; G01R 31/3183; G01R 31/318502;
(Continued)

(56) References Cited

U.S. PATENT DOCUMENTS 7,631,237 B2 * 12/2009 Kiryu ............. G01R 31/318547
714/726
8,103,464 B2 *  1/2012 Sasaki ............. G01R 31/31813
702/58
(Continued)

FOREIGN PATENT DOCUMENTS

JP    2006-313133 A    11/2006

OTHER PUBLICATIONS

Goh, Novel Fault Localization Approach For ATPG / Scan-Fault Failures in Complex Sub-Nano FPGA/ASIC Debugging, 2010, IEEE, pp. 1-4. (Year: 2010).*
(Continued)

*Primary Examiner* — John J Tabone, Jr.
(74) *Attorney, Agent, or Firm* — McDermott Will & Emery LLP

(57) ABSTRACT

A failure diagnostic apparatus includes a path calculation unit which calculates, for each input pattern to a diagnosis target cell, a path affecting an output value of the diagnosis target cell when a failure is assumed as an activation path, a path classification unit which classifies the activation path associated with the input pattern for which the diagnosis target cell has passed a test and the activation path associated with the input pattern for which the diagnosis target cell has failed the test, a path narrowing unit which calculates a first failure candidate path, a second failure candidate path and a normal path of the diagnosis target cell based on classified activation paths, and a result output unit which outputs information on the first failure candidate path, the second failure candidate path and the normal path.

8 Claims, 27 Drawing Sheets

(51) Int. Cl.
*G01R 31/3185* (2006.01)
*G01R 31/317* (2006.01)
*G01R 31/3183* (2006.01)

(52) U.S. Cl.
CPC . *G01R 31/31704* (2013.01); *G01R 31/31707* (2013.01); *G01R 31/318502* (2013.01); *G01R 31/318533* (2013.01); *G01R 31/318583* (2013.01)

(58) Field of Classification Search
CPC .... G01R 31/318533; G01R 31/318583; G01R 31/31704; G01R 31/31707
USPC ....... 714/729, 715, 724, 726, 727, 734, 735, 714/741, 742
See application file for complete search history.

(56) References Cited

U.S. PATENT DOCUMENTS

| | | | | |
|---|---|---|---|---|
| 9,864,004 | B1* | 1/2018 | Chillarige | G06F 11/00 |
| 10,338,137 | B1* | 7/2019 | Chillarige | G01R 31/31835 |
| 2005/0015691 | A1* | 1/2005 | Nozuyama | G11C 29/56 |
| | | | | 714/724 |
| 2006/0041812 | A1* | 2/2006 | Rajski | G11C 29/40 |
| | | | | 714/742 |
| 2008/0250284 | A1* | 10/2008 | Guo | G01R 31/318541 |
| | | | | 714/726 |
| 2010/0244853 | A1* | 9/2010 | Tong | G01R 31/318566 |
| | | | | 324/537 |
| 2011/0154139 | A1* | 6/2011 | Ishida | G01R 31/31835 |
| | | | | 714/726 |
| 2016/0116533 | A1* | 4/2016 | Ishida | G01R 31/318342 |
| | | | | 714/726 |
| 2018/0003768 | A1* | 1/2018 | Douskey | G01R 31/3177 |
| 2018/0180672 | A1* | 6/2018 | Maeda | G01R 31/318555 |
| 2018/0267098 | A1* | 9/2018 | Kundu | G06F 30/33 |

OTHER PUBLICATIONS

Sharma et al., Faster Defect Localization in Nanometer Technology based on Defective Cell Diagnosis, 2007, IEEE, pp. 1-10. (Year: 2007).*

* cited by examiner

FIG. 6

| SEGMENT | INPUT SIDE | OUTPUT SIDE |
|---|---|---|
| SG100 | VDD1 | TrP1 |
| SG101 | A | TrP1 |
| SG102 | TrP1 | V1 |
| SG103 | VDD2 | TrP2 |
| SG104 | B | TrP2 |
| SG105 | TrP2 | V1 |
| SG106 | V1 | YB |
| SG107 | GND | TrN2 |
| SG108 | B | TrN2 |
| SG109 | TrN2 | TrN1 |
| SG110 | A | TrN1 |
| SG111 | TrN1 | YB |

FIG. 7

| Tr | S | G | D |
|---|---|---|---|
| TrP1 | SG100 | SG101 | SG102 SG106 |
| TrP2 | SG103 | SG104 | SG105 SG106 |
| TrN1 | SG109 | SG110 | SG111 |
| TrN2 | SG107 | SG108 | SG109 |

FIG. 8

| Tr | A=0, B=0 | | | | A=0, B=1 | | | | A=1, B=0 | | | | A=1, B=1 | | | |
|---|---|---|---|---|---|---|---|---|---|---|---|---|---|---|---|---|
| | STATE | S | G | D | STATE | S | G | D | STATE | S | G | D | STATE | S | G | D |
| TrP1 | ON | 1 | 0 | 1 | ON | 1 | 0 | 1 | OFF | 1 | 1 | X | OFF | 1 | 1 | X |
| TrP2 | ON | 1 | 0 | 1 | OFF | 1 | 0 | X | ON | 1 | 0 | 1 | OFF | 1 | 1 | X |
| TrN1 | OFF | X | 0 | X | OFF | 0 | 0 | X | ON | X | 1 | X | ON | 0 | 1 | 0 |
| TrN2 | OFF | 0 | 0 | X | ON | 0 | 0 | 0 | OFF | 0 | 0 | X | ON | 0 | 1 | 0 |

FIG. 10

| SEGMENT | EXPECTED VALUE | FAILURE 1 | FAILURE 2 |
|---|---|---|---|
| SG100 | 1 | 1 | 1 |
| SG101 | 0 | 0→1 | 0 |
| SG102 | 1 | 1→X | 1 |
| SG103 | 1 | 1 | 1 |
| SG104 | 0 | 0 | 0 |
| SG105 | 1 | 1 | 1 |
| SG106 | 1 | 1 | 1→0 |
| SG107 | 0 | 0 | 0 |
| SG108 | 0 | 0 | 0 |
| SG109 | X | X | X |
| SG110 | 0 | 0 | 0 |
| SG111 | X | X | X |

FIG. 12

| A=0, B=0 | | A=0, B=1 | | A=1, B=0 | | A=1, B=1 | |
|---|---|---|---|---|---|---|---|
| NUMBER FROM YB | COMPONENT | NUMBER FROM YB | COMPONENT | NUMBER FROM YB | COMPONENT | NUMBER FROM YB | COMPONENT |
| 1 | SG106 | 1 | SG106 | 1 | SG106 | 1 | SG111 |
| 2 | V1 | 2 | V1 | 2 | V1 | 2 | TrN1 |
| | | 3 | SG102 | 3 | SG105 | 3-1 | SG110 |
| | | 4 | TrP1 | 4 | TrP2 | 3-2 | SG109 |
| | | 5-1 | SG100 | 5-1 | SG103 | 4 | TrN2 |
| | | 5-2 | SG101 | 5-2 | SG104 | 5-1 | SG108 |
| | | | | | | 5-2 | SG107 |

FIG. 14

| A | B | EXPECTED VALUE OF YB | RESULT OF TEST | PASS/FAIL DETERMINATION |
|---|---|---|---|---|
| 0 | 0 | 1 | 0 | FAIL |
| 0 | 1 | 1 | 0 | FAIL |
| 1 | 0 | 1 | 0 | FAIL |
| 1 | 1 | 0 | 0 | PASS |

FAILURE DIAGNOSTIC APPARATUS AND FAILURE DIAGNOSTIC METHOD

The disclosure of Japanese Patent Application No. 2020-024177 filed on Feb. 17, 2020 including the specification, drawings and abstract is incorporated herein by reference in its entirety.

BACKGROUND

The present disclosure relates to a failure diagnostic apparatus and a failure diagnostic method.

Recently, miniaturization and complexity of integrated circuits have advanced, and it is becoming difficult to identify a failure location inside a basic circuit (cell) which realizes a basic logic operation only by physical analysis. For this reason, a method of identifying a candidate of a logical failure location in a cell by using failure diagnosis software is used.

There is a disclosed technique listed below.
[Patent Document 1] Japanese Unexamined Patent Application Publication No. 2006-313133

For example, Patent Document 1 discloses a technique for identifying failure location candidates in a cell by using failure diagnosis software. The failure diagnosis software described in Patent Document 1 outputs the failure location candidates having a high rate of agreement with a failure diagnosis simulation condition as failure location candidates having a high degree of accuracy.

SUMMARY

Some conventional failure diagnosis software outputs a failure location candidate together with a score indicating a height of an agreement rate with a failure diagnosis simulation condition. In such failure diagnosis software, only the failure location candidate having a high degree of accuracy and having a high score is output.

If the output score of the failure location candidate is not the highest value, the person who performs the failure analysis (analyst) needs to verify the reason. That is, the analyst needs to investigate whether a failure exists in a region other than the failure location candidate output by the failure diagnosis software. However, since the conventional failure diagnosis software only outputs the failure location candidate having the high degree of accuracy together with the high score thereof, the analyst cannot efficiently investigate whether a failure exists in a region other than the output failure location candidate.

Other objects and new features will be apparent from the description of this specification and the accompanying drawings.

A failure diagnostic apparatus according to one embodiment includes a path calculation unit which calculates, for each input pattern to a diagnosis target cell, a path affecting an output value of the diagnosis target cell when a failure is assumed as an activation path, a path classification unit which classifies the activation path associated with the input pattern for which the diagnosis target cell has passed a test and the activation path associated with the input pattern for which the diagnosis target cell has failed the test, a path narrowing unit which calculates a first failure candidate path, a second failure candidate path and a normal path of the diagnosis target cell based on classified activation paths, and a result output unit which outputs information on the first failure candidate path, the second failure candidate path and the normal path.

According to one embodiment, it is possible to provide a failure diagnostic apparatus for outputting information that enables an analyst to efficiently investigate whether a failure exists in a region other than a failure location candidate having a high degree of accuracy.

BRIEF DESCRIPTION OF THE DRAWINGS

FIG. 6 is a table showing segment connection information of the 2-input NAND cell.

FIG. 7 is a table showing transistor connection information of the 2-input NAND cell.

FIG. 8 is a table showing ON/OFF states of transistors in the 2-input NAND cell and the state value of each node.

FIG. 10 is a table showing an example of a result of a failure simulation for the 2-input NAND cell.

FIG. 12 is a table showing information on the activation paths of the 2-input NAND cell.

FIG. 14 is a table showing an example of a pass/fail truth table of the 2-input NAND cell.

DETAILED DESCRIPTION

Figure 1:
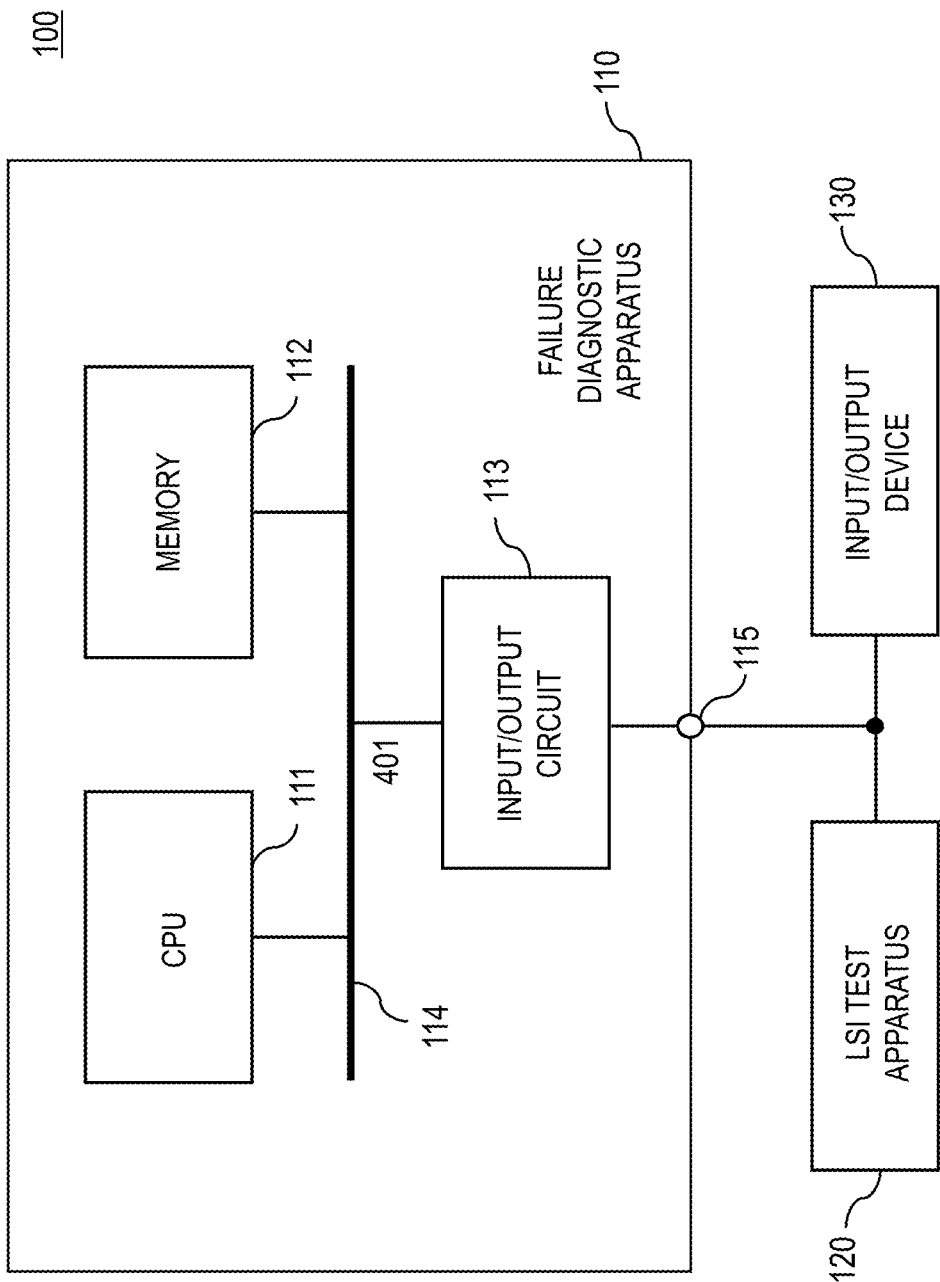
FIG. 1 is a block diagram showing an example of a hardware configuration of a failure diagnostic system according to the first embodiment.

Hereinafter, embodiments will be described in detail with reference to the drawings. In the specification and the drawings, the same or corresponding components are denoted by the same reference numerals, and a repetitive description thereof is omitted. In the drawings, for convenience of description, the configuration may be omitted or simplified.

First Embodiment

FIG. 1 is a block diagram showing an example of a hardware configuration of a failure diagnostic system 100 according to the first embodiment. As shown in FIG. 1, the failure diagnostic system 100 includes a failure diagnostic apparatus 110, a Large Scale Integration (LSI) test apparatus 120 and an input/output device 130. The failure diagnostic apparatus 110 is connected to the LSI-test device 120 and the input/output device 130.

The failure diagnostic apparatus 110 includes a Central Processing Unit (CPU) 111, a memory 112, an input/output circuit 113, a bus 114, and an input/output terminal 115. An example of the failure diagnostic apparatus 110 includes a computer such as a personal computer, a server, and the like.

The CPU 111 is connected to the memory 112 and the input/output circuit 113 through the bus 114. The memory 112 stores a program for performing failure diagnosis processing. When performing the failure diagnosis processing, the CPU 111 reads the program stored in the memory 112 and executes the read program.

The memory 112 is also used as a region for storing various kinds of information generated during the execution of the failure diagnosis processing. The memory 112 may be a volatile memory, such as a Dynamic Random Access Memory (DRAM), or may be a non-volatile memory, such as a flash memory. Further, the memory 112 may be configured by a Hard Disk Drive (HDD), an optical disk drive, or the like, as long as it can store programs and data.

The input/output circuit 113 is connected to the input/output terminal 115. The input/output circuit 113 transmits and receives data to and from the LSI test apparatus 120 and the input/output device 130 through the input/output terminal 115. The input/output circuit 113 output data obtained from the LSI test apparatus 120 and the input/output device 130 to the CPU 111 or the memory 112. Examples of the input/output device 130 include a keyboard, a mouse, a display, a printer, an interface for connecting to an external storage device, and the like.

Figure 2:
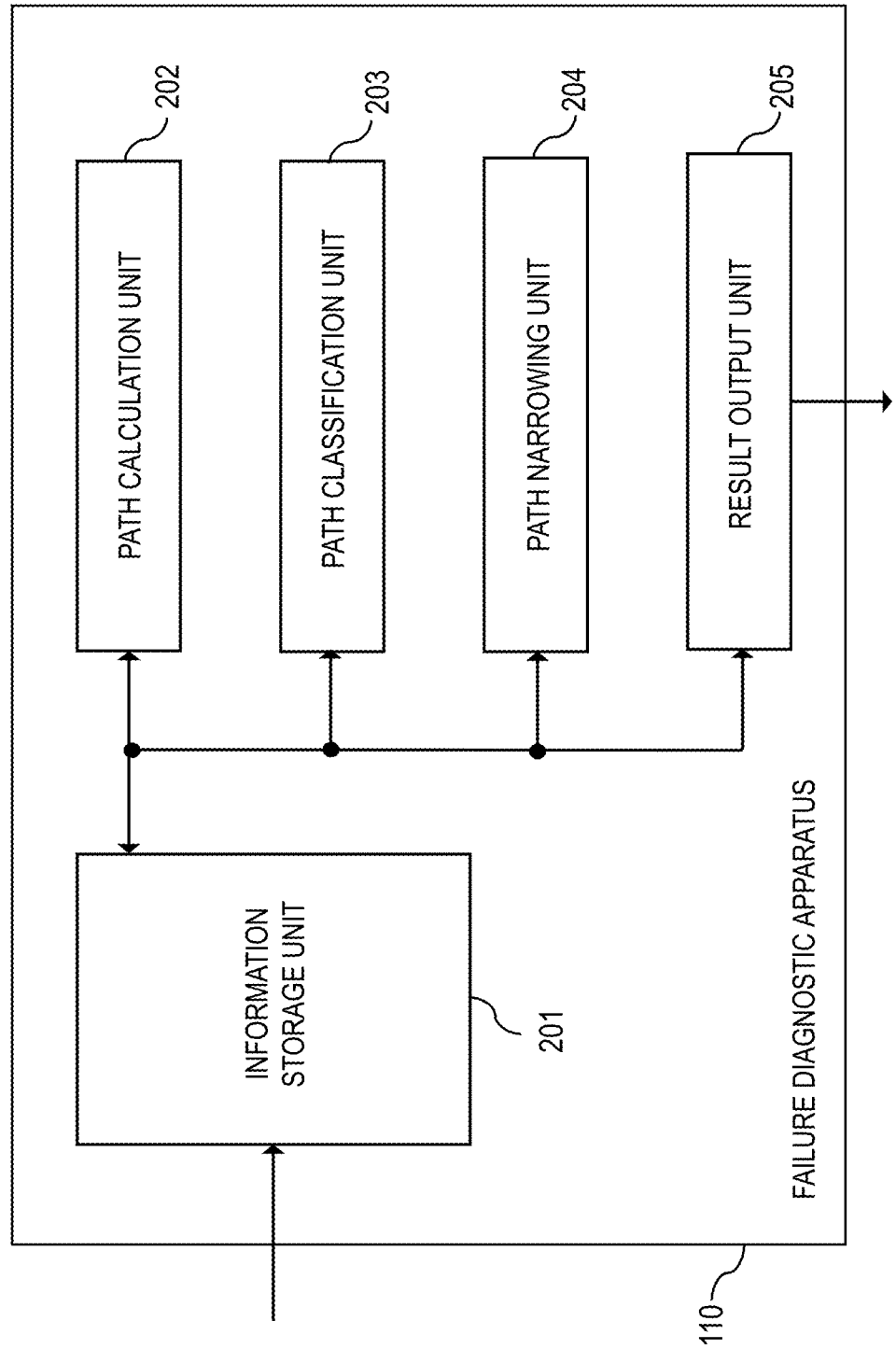
FIG. 2 is a block diagram showing an example of functional blocks of a failure diagnostic apparatus according to the first embodiment.

FIG. 2 is a block diagram showing an example of functional blocks of the failure diagnostic apparatus 110 according to the first embodiment. As shown in FIG. 2, the failure diagnostic apparatus 110 includes an information storage unit 201, a path calculation unit 202, a path classification unit 203, a path narrowing unit 204, and a result output unit 205. The information storage unit 201 may be configured by a portion of a region of the memory 112. Further, the functions of the path calculation unit 202, the path classification unit 203, the path narrowing unit 204, and the result output unit 205 can be realized by the CPU 111 executing the program for the failure diagnosis stored in the memory 112.

The information storage unit 201 stores diagnosis target cell information, circuit connection information, circuit coordinate information, layout information, expected value information, pass/fail information, path information, path classification information, and path narrowing information. The information storage unit 201 receives the diagnosis target cell information, the circuit connection information, the circuit coordinate information, the layout information, the expected value information and the pass/fail information from the LSI test apparatus 120 or the input/output device 130, and stores the received information.

Further, the information storage unit 201 is connected to the path calculation unit 202, the path classification unit 203, the path narrowing unit 204, and the result output unit 205. The information storage unit 201 obtains the path information from the path calculation unit 202 and stores the obtained path information. The information storage unit 201 obtains the path classification information from the path classification unit 203 and stores the obtained path classification information. The information storage unit 201 obtains the path narrowing information from the path narrowing unit 204, and stores the obtained path narrowing information.

The diagnosis target cell information is information for identifying a target cell for failure diagnosis. A cell is a basic circuit that realizes a basic operation included in an integrated circuit. Hereinafter, the target cell for the failure diagnosis is referred to as a diagnosis target cell. The diagnosis target cell information includes a cell having a failure location candidate obtained by a method of narrowing down a failure location in a unit of a signal line between cells, that is, a name of a diagnosis target cell. The method of narrowing down the failure location of the signal line unit between the cells is one of the known failure diagnosis methods, and a method of narrowing down the failure location in the unit of the signal line between cells using a failure simulation method or a back trace method.

The circuit connection information is information indicating connection relationships among power supply terminals, transistors, vias, and the like, which are components of the diagnosis target cell, and is also called a Simulation Program with Integrated Circuit Emphasis (SPICE) netlist.

The circuit coordinate information is information indicating in-cell coordinates of the components of the diagnosis target and is also called a Layout Versus Schematic (LVS).

The layout information is layout information such as a diffusion layer, wiring, and via in the diagnosis target cell.

The expected value information is the pattern information of the input and output signals for confirming the operation of the diagnosis target cell. The expected value information includes an input value (input pattern) and an output expected value (output pattern). The output expected value is a value (expected value) which is expected as an output value of the diagnosis target cell when an input pattern is input to the diagnosis target cell.

The pass/fail information is information including a result (test result) obtained by performing a test of the LSI using the LSI test apparatus. Specifically, the entire LSI is tested using the LSI test apparatus. Based on the result of the entire LSI test, the failure location in the unit of the signal line between the cells is narrowed down. The pass/fail information is information indicating a test result for each input pattern which is input to a cell (diagnosis target cell) including a failure location candidate obtained by the narrowing down. The test result is indicated by "pass" or "fail". If the operation of the diagnosis target cell in the LSI is as expected, it is regarded as "pass". On the other hand, if the operation of the diagnosis target cell in the LSI is not as expected, it is regards as "fail".

The path calculation unit 202 receives the diagnosis target cell information, the circuit connection information, and the expected value information from the information storage unit 201. The path calculation unit 202 calculates, for each input pattern to a diagnosis target cell, a path affecting the output value of the diagnosis target cell when a failure is assumed based on the diagnosis target cell information, the circuit connection information, and the expected value information. Hereinafter, the path affecting the output value of the diagnosis target cell when the failure is assumed is referred to as an activation path. The path calculation unit 202 stores the information on the calculated activation path in the information storage unit 201 as the path information.

The path classification unit 203 receives the pass/fail information and the path information from the information storage unit 201. As described above, the pass/fail information includes the test result of the diagnosis target cell, which is indicated by "pass" or "fail". Based on the pass/fail information and the path information, the path classification unit 203 classifies the activation paths of the diagnosis target cell into the activation path associated with the input pattern for which the diagnosis target cell has passed the test and the activation path associated with the input pattern for which the diagnosis target cell has failed the test. Hereinafter, the activation path associated with the input pattern for which the diagnosis target cell has passed the test is referred to as a pass activation path. Further, hereinafter, the activation path associated with the input pattern for which the diagnosis target cell has failed the test is referred to as a fail activation path. The path classification unit 203 stores the information on the pass activation path and the fail activation path in the information storage unit 201 as the path classification information.

The path narrowing unit 204 receives the path classification information from the information storage unit 201. The path narrowing unit 204 calculates a path incorporating all the fail activation paths and a path common to all the fail activation paths based on the information of the fail activation path included in the path classification information. Hereinafter, the path incorporating all the fail activation paths and the path common to all the fail activation paths are referred to as a full fail activation path and a common fail activation path, respectively.

In addition, the path narrowing unit 204 calculates a path incorporating all the pass activation paths based on the pass activation path included in the received path classification information. Hereinafter, the path incorporating all the pass activation paths is referred to as a full pass activation path.

Thereafter, the path narrowing unit 204 performs processing (first removal processing) of removing the full pass activation path from the common fail activation path. The path narrowing unit 204 calculates the path left by the first removal processing as the first failure candidate path.

Next, the path narrowing unit 204 performs processing (second removal processing) of removing the first failure candidate path from the full fail activation path. The path narrowing unit 204 calculates the path left by the second removal processing as the second failure candidate path.

Finally, the path narrowing unit 204 performs processing (third removal processing) of removing the first failure candidate path and the second failure candidate path from the full pass activation path. The path narrowing unit 204 calculates the path left by the third removal processing as a normal path.

The path narrowing unit 204 stores the first failure candidate path, the second failure candidate path, and the normal path as the path narrowing information in the information storage unit 201.

The result output unit 205 receives the path narrowing information from the information storage unit 201. The result output unit 205 outputs the received path narrowing information to the input/output device 130. At this time, the result output unit 105 may further receive the circuit coordinate information and the layout information from the information storage unit 201, and output coordinate information of the display region for displaying the path narrowing information on the layout of the diagnosis target cell. In this case, the first failure candidate path, the second failure candidate path, and the normal path are visually displayed on the layout of the diagnosis target cell at the same time.

In the above description, the path calculation unit 202, the path classification unit 203, the path narrowing unit 204, and the result output unit 205 receive information necessary for each processing of the failure diagnosis through the information storage unit 201, but the present disclosure is not limited thereto. For example, the path calculation unit 202 may be configured to directly receive the diagnosis target cell information from the input/output device 130. Further, for example, the path classification unit 203 may be configured to directly receive the path information from the path calculation unit 202.

Figure 3:
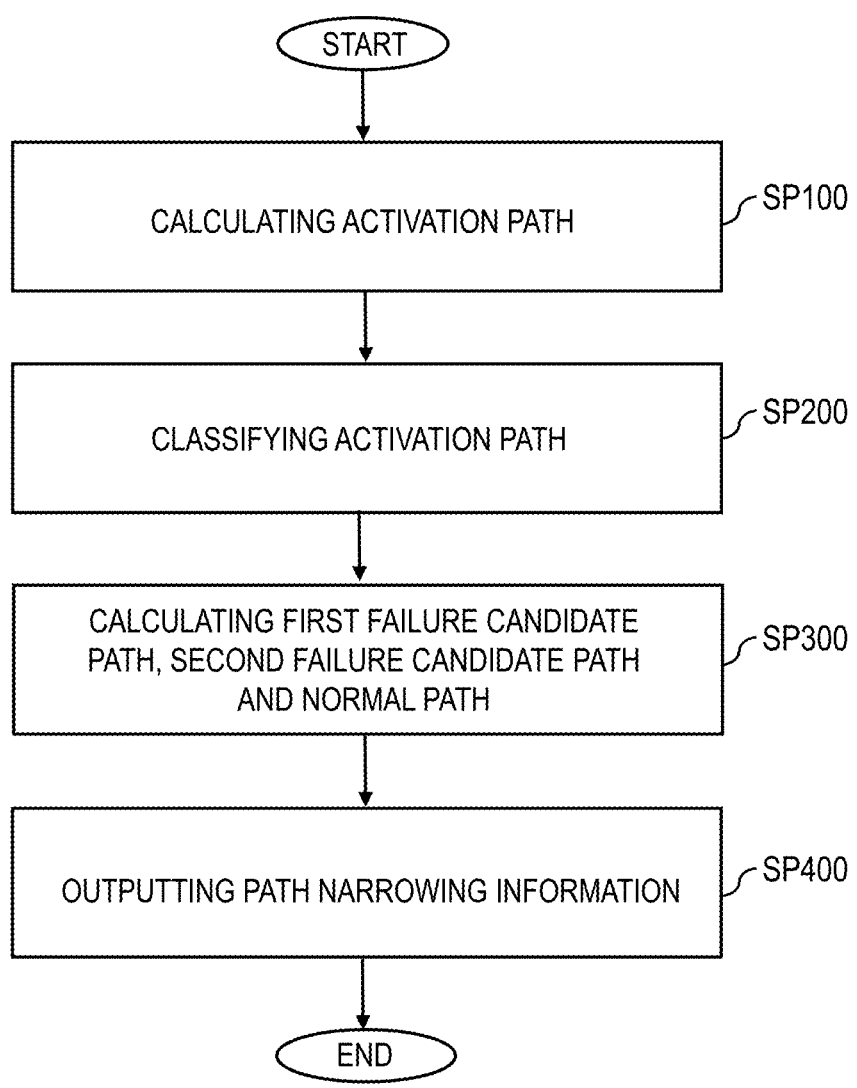
FIG. 3 is a flowchart showing an example of a failure diagnostic method in the failure diagnostic apparatus according to the first embodiment.

Next, the failure diagnostic apparatus 110 according to the first embodiment will be described. FIG. 3 is a flowchart showing an example of a failure diagnostic method in the failure diagnostic apparatus 110 according to the first embodiment. As shown in FIG. 3, the failure diagnostic method according to the first embodiment includes four processing steps of steps SP100 to SP400.

First, in the step SP100, processing of calculating an activation path is performed. The path calculation unit 202 analyzes the connection relationship of the components of the diagnosis target cell based on the diagnosis target cell information and the circuit connection information. Further, the path calculation unit 202 calculates the activation path of the diagnosis target cell based on the analyzed result and the expected value information. Information on the calculated activation path is stored in the information storage unit 201 as the path information.

Next, in the step SP200, processing of classifying the activation paths is performed. The path classification unit 203 classifies the activation paths calculated in the step SP100 into the pass activation path and the fail activation path based on the pass/fail information. Information on the classified activation paths (pass activation path and fail activation path) is stored in the information storage unit 201 as the path classification information.

Next, in the step SP300, processing of calculating the first failure candidate path, the second failure candidate path, and the normal path is performed. The path narrowing unit 204 calculates the full fail activation path, the common fail activation path, and the full pass activation path based on the fail activation paths and the pass activation paths. Further, the path narrowing unit 204 calculates the first failure candidate path, the second failure candidate path, and the normal path by performing the first to third removal processing. Information on the calculated first failure candidate path, the second failure candidate path, and the normal path is stored in the information storage unit 201 as the path narrowing information.

Finally, in the step SP400, processing of outputting the path narrowing information is performed. The result output unit 205 outputs the path narrowing information to the input/output device 130. When the path narrowing information is output together with the coordinate information of the display region for displaying on the layout of the diagnosis target cell, the first failure candidate path, the second failure candidate path, and the normal path are visually displayed on the display which is an example of the input/output device 130.

Figure 4:
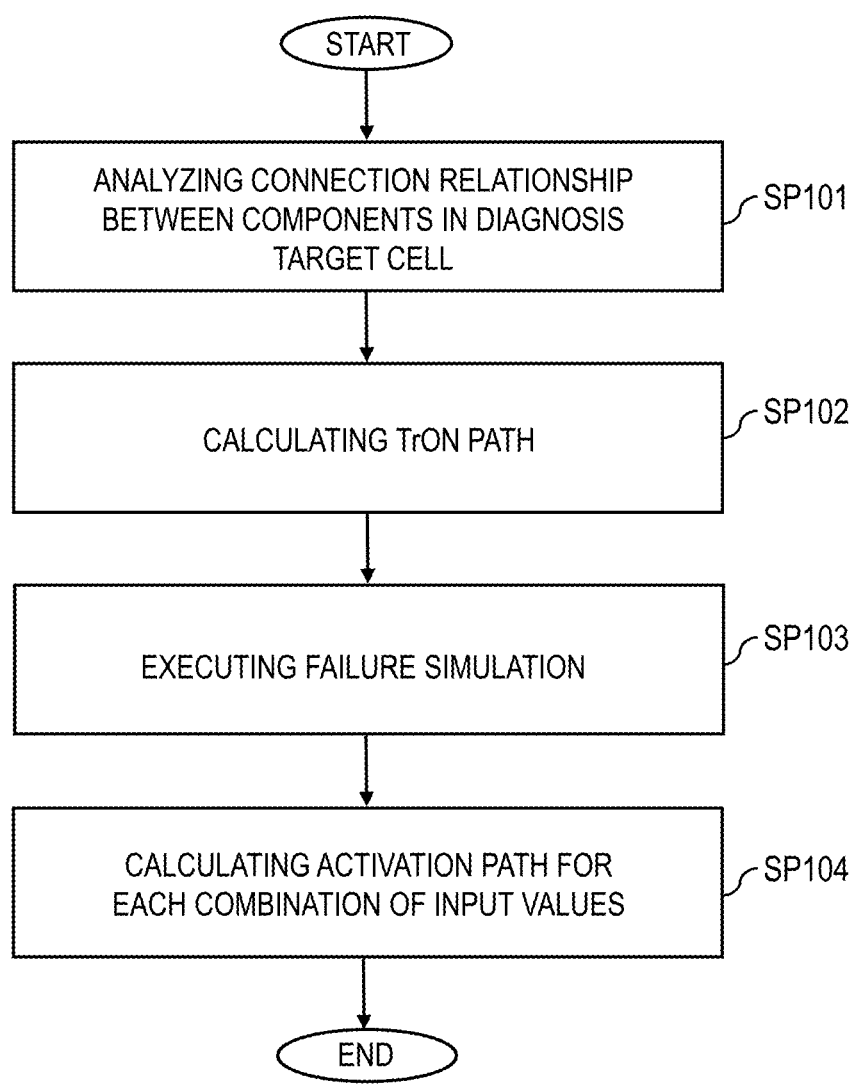
FIG. 4 is a flowchart showing an example of details of processing of calculating an activation path.

Details of each of the four processing steps shown in FIG. 3 will be described below. FIG. 4 is a flowchart showing an example of details of the processing of calculating the activation path (step SP100 of FIG. 3). As shown in FIG. 4, the processing of calculating the activation path is configured by four processing steps of steps SP101 to SP104.

First, in the step SP101, processing of analyzing the connection relationship of the components of the diagnosis target cell is performed. Specifically, the path calculation unit 202 extracts each segment in the diagnosis target cell based on the diagnosis target cell information and the circuit connection information.

Figure 5:
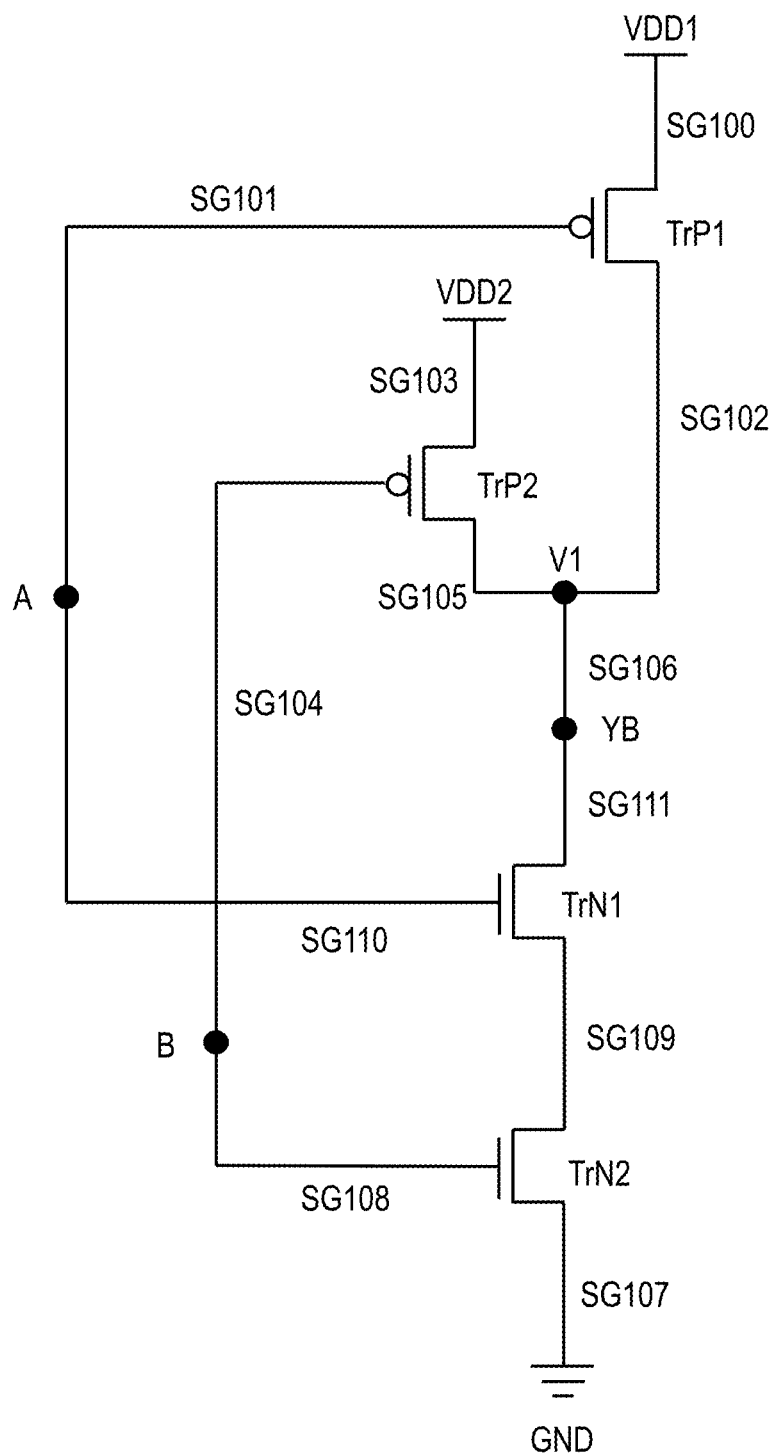
FIG. 5 is a circuit diagram of the 2-input NAND cell.

The diagnosis target cell includes, as the components, the transistors, the terminals, the vias, and the segments connecting them. Hereinafter, the first embodiment will be described with reference to a 2-input NAND cell as an example of the diagnosis target cell. FIG. 5 is a circuit diagram of the 2-input NAND cell. As shown in FIG. 5, the 2-input NAND cell includes, as components, transistors TrP1, TrP2, TrN1 and TrN2, input terminals A and B, an output terminal YB, power supply terminals VDD1, VDD2 and GND, a via V1, and segments SG101 to SG111. In FIG. 5, the path calculation unit 202 extracts the segments SG101 to SG111.

Next, the path calculation unit 202 analyzes the connection relationship of the components in the diagnosis target cell to extract information on the connection relationship between the segment and the component other than the segment, and information on the connection relationship between the node (source, gate, or drain) of the transistor and the segment. Hereinafter, the information on the connection relationship between the segment and the component other than the segment and the information on the connection relationship between the node of the transistor and the segment are referred to as segment connection information and transistor connection information, respectively.

FIG. 6 is a table showing the segment connection information of the 2-input NAND cell. As shown in FIG. 6, the segment connection information is information in which a segment, a component connected to the input side of the segment, and a component connected to the output side of the segment are associated with each other. From the segment connection information of FIG. 6, for example, it can be seen that the segment SG100 is connected to the power supply terminal VDD1 at the input side and to the transistor TrP1 at the output side.

FIG. 7 is a table showing the transistor connection information of the 2-input NAND cell. As shown in FIG. 7, the transistor connection information is information in which a transistor (Tr) included in the 2-input NAND cell, a segment connected to the source (S) of the transistor, a segment connected to the gate (G) of the transistor, and a segment connected to the drain (D) of the transistor are associated with each other. From the transistor connection information of FIG. 7, for example, it can be seen that the source of the transistor TrP1 is connected to the segment SG100, the gate of the transistor TrP1 is connected to the segment SG101, and the drain of the transistor TrP1 is connected to the segments SG102 and SG106.

Incidentally, in the transistor connection information shown in FIG. 7, as illustrated in the segments SG102 and SG106 connected to the drain of the transistor TrP1, the segments connected to each other through the via V1 are described collectively.

Next, in the step SP102 of FIG. 4, processing of calculating a path in which a transistor in a conduction state (ON state) is included and the input pattern to the diagnosis target cell determines the output value (output state) of the diagnosis target cell is performed. Hereinafter, the path in which the input pattern to the diagnosis target cell determines the output value of the diagnosis target cell is referred to as a TrON path.

Specifically, the path calculation unit 202 executes a logic simulation for the diagnosis target cell based on the circuit connection information, the expected value information, and the transistor connection information. As the logic simulation, for example, a switch level simulation (SLS) is used.

Based on the result of the logic simulation, the path calculation unit 202 calculates the state values of the segments for each input pattern to the diagnosis target cell and identifies the conduction state or the non-conduction state (ON/OFF state) of each transistor.

FIG. 8 is a table showing the ON/OFF states of the transistors in the 2-input NAND cell and the state value of each node, which are identified based on the result of the logic simulation. In the 2-input NAND cell, there are four input patterns. As shown in FIG. 8, for each input pattern (a combination of input values A and B), the ON/OFF states of the four transistors TrP1, TrP2, TrN1 and TrN2 are shown. The conduction state of the transistor is indicated by ON, and the non-conduction state of the transistor is indicated by OFF. Further, the state values of the source (S), gate (G) and drain (D) of each transistor are shown using a logic value of 1 or 0. However, when the state value is indefinite, it is indicated by X.

Next, the path calculation unit 202 refers to the ON/OFF state of the identified transistor and extracts the transistor in the ON state as a transistor for determining the output state of the diagnosis target cell. Furthermore, the path calculation unit 202 calculates the TrON path for each input pattern to the diagnosis target cell based on the extracted transistor in the ON state and the transistor connection information.

Figure 9:
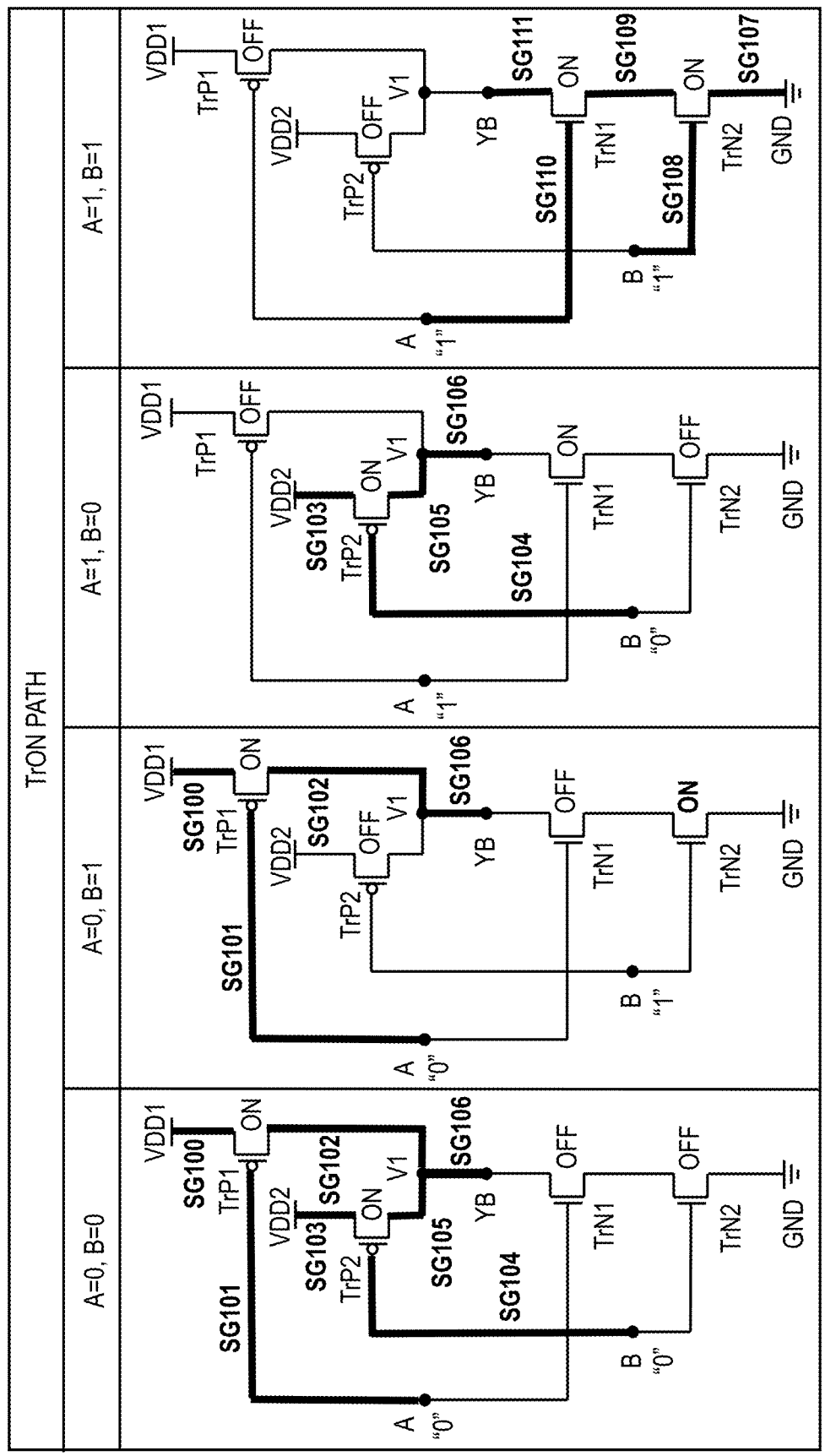
FIG. 9 is a circuit diagram showing TrON paths of the 2-input NAND cell.

FIG. 9 is a circuit diagram showing the TrON paths of the 2-input NAND cell that is calculated based on the segment connection information of FIG. 6, the transistor connection information of FIG. 7, and the information of the transistor in the ON state shown in FIG. 8. As shown in FIG. 9, the TrON path is calculated for each input pattern to the 2-input NAND cell. In FIG. 9, the segment on the TrON path is clearly indicated by a thick line.

Here, the processing of calculating the TrON path when the input pattern to the 2-input NAND cell is A=0 and B=0 will be described with reference to FIGS. 6 to 9. First, referring to FIG. 8, when the input pattern is A=0 and B=0, the transistors TrP1 and TrP2 are in the ON state, the transistors TrN1 and TrN2 are in the OFF state. Therefore, it can be seen that the transistors TrP1 and TrP2 in the ON state are transistors that determine the output state of the 2-input NAND cell when the input pattern is A=0 and B=0. Accordingly, the path calculation unit 202 extracts the transistors TrP1 and TrP2 as transistors that determines the output state of the 2-input NAND cell when the input pattern is A=0 and B=0.

Next, referring to the transistor connection information of FIG. 7, it can be seen that the segments connected to the extracted transistor TrP1 are the segments SG100, SG101, SG102 and SG106. Similarly, it can be seen that the segments connected to the extracted transistor TrP2 are the segments SG103, SG104, SG105 and SG106.

The path calculation unit 202 calculates a path in which the input pattern to the 2-input NAND cell determines the output state of the 2-input NAND cell based on the information of the segments connected to the transistors TrP1 and TrP2, and the segment information in FIG. 6. As a result, as shown in FIG. 9, the path calculation unit 202 calculates that the TrON path when the input pattern to the 2-input NAND cell is A=0 and B=0 is configured by the transistors TrP1 and TrP2, the segments SG100, SG101, SG102, SG103, SG104, SG105, and SG106, and the via V1.

Next, in the step SP103 of FIG. 4, a failure simulation for the diagnosis target cell is executed based on the expected value information and the information on the TrON path. Specifically, the path calculation unit 202 extracts segments in the TrON path one by one and sets an inversion value that differs from the expected value as the state value (logical value) of the extracted segment. For example, when the expected value of the extracted segment is "1", the inversion value is set to "0". Thus, by setting the inversion value for the extracted segment, a failure of the segment is assumed.

The path calculation unit 202 executes the logic simulation of the switching operation of the transistor the in TrON path, that is, the failure simulation, assuming the failure for the segment in this manner. Then, the path calculation unit 202 compares the result of the failure simulation of the output value of the diagnosis target cell with the output expected value of the diagnosis target cell. Based on the result of the comparison between the result of the failure simulation and the comparison value, the path calculation unit 202 determines whether the segment in which the failure is assumed affects the output value of the diagnosis target cell.

More specifically, when the result of the failure simulation and the output expected value match, the path calculation unit 202 determines that the segment in which the failure is assumed is a segment that does not affect the output value of the diagnosis target cell. On the other hand, when the result of the failure simulation and the output expected value do not match, the path calculation unit 202 determines that the segment in which the failure is assumed is a segment that affects the output value of the diagnosis target cell.

The path calculation unit 202 executes the failure simulation for all segments in the TrON path. In addition, when there is a plurality of input patterns to the diagnosis target cell and there is a plurality of TrON paths, the path calculation unit 202 executes the failure simulation for the segments in all TrON paths. In this way, the path calculation unit 202 calculates the result obtained by the failure simulation, that is, the information of whether the segment affects the output value of the diagnosis target cell when the failure is assumed.

Here, with reference to FIG. 10, an example of the failure simulation will be described. FIG. 10 is a table showing a result of the failure simulation in the TrON path when the input pattern to the 2-input NAND cell is A=0 and B=0. As shown in FIG. 10, the expected value of each segment is shown as a logical value. These expected values indicate the expected values of the respective segments when the input pattern to the 2-input NAND cell is A=0 and B=0. Further, since the output value of the 2-input NAND cell when the input pattern to the 2-input NAND cell is A=0 and B=0 is "1", the expected value of the segment SG106 connected to the output terminal YB is "1".

In this state, a failure simulation 1 (failure 1) and a failure simulation 2 (failure 2) are executed. The failure simulation 1 corresponds to an example of a segment in which a failure is assumed does not affect the output value of the 2-input NAND cell. On the other hand, the failure simulation 2 corresponds to an example of a segment in which a failure is assumed affects the output value of the 2-input NAND cell.

First, in the failure simulation 1, a failure of the segment SG101 is assumed. That is, although the expected value of the state value of the segment SG101 is "0", the failure simulation is executed by setting the inversion value of "1" as the state value. The result of the failure simulation 1 are shown in a column of a failure 1 in FIG. 10. As shown in FIG. 10, since the transistor TrP1 is in the non-conduction state (OFF state) by changing the state value of the segment SG101 from "1" to "0", the state value of the segment SG102 changes from "1" to "X". "X" indicates an indefinite state.

However, the segment SG106 connected to the output terminal YB is connected to both the segment SG105 and the segment SG106 through the via V1. That is, the state value of the segment SG106 is determined not by the segment SG106 which is an indefinite state value but by the state value of the segment SG105. As shown in FIG. 10, since the state value of the segment SG105 is "1", the state value of the segment SG106 is "1". Therefore, as the result of the failure simulation 1, the output value of the 2-input NAND cell is "1", which is the same as the output expected value.

Thus, in the case of the failure simulation 1, even if the failure of the segment SG101 is assumed, it does not affect the output value of the 2-input NAND cell. Therefore, the segment SG101 is determined to be a segment that does not affect the output value of the 2-input NAND cell if a failure is assumed.

On the other hand, in the failure simulation 2, a failure of the segment SG106 is assumed. That is, although the expected value of the state value of the segment SG106 is "1", the failure simulation is executed by setting the inversion value of "0" as the state value. The result of the failure simulation 2 are shown in a column of a failure 2 in FIG. 10. As shown in FIG. 10, the state value of the segment SG106 changes from "1" to "0".

Since the segment SG106 is connected to the output terminal YB, when the state value of the segment SG106 changes from "1" to "0", the output value of the output terminal YB also changes from "1" to "0". Therefore, as the result of the failure simulation 2, the output value of the 2-input NAND cell changes from "1" to "0".

Thus, in the case of the failure simulation 2, if the failure of the segment SG106 is assumed, it affects the output value of the 2-input NAND cell. Therefore, the segment SG106 is determined to be a segment that affects the output value of the 2-input NAND cell if a failure is assumed.

Finally, in the step SP104 of FIG. 4, processing of calculating the activation path is performed for each input pattern to the diagnosis target cell. Specifically, the path calculation unit 202 refers to the information on whether the segment affects the output value of the diagnosis target cell if the failure is assumed, and extracts the segment affecting the output value of the diagnosis target cell. Then, the path calculation unit 202 calculates, for each input pattern to the diagnosis target cell, the activation path based on the extracted segment, the segment connection information, and the transistor connection information.

As described above, the activation path is a path that affects the output value of the diagnosis target cell if a failure is assumed. Therefore, in the processing of calculating the activation path for each input pattern, the segments that affect the output value of the diagnosis target cell and other components (transistors and vias) connected thereto are calculated as the activation path in consideration of the input side and the output side of the diagnosis target cell.

Figure 11:
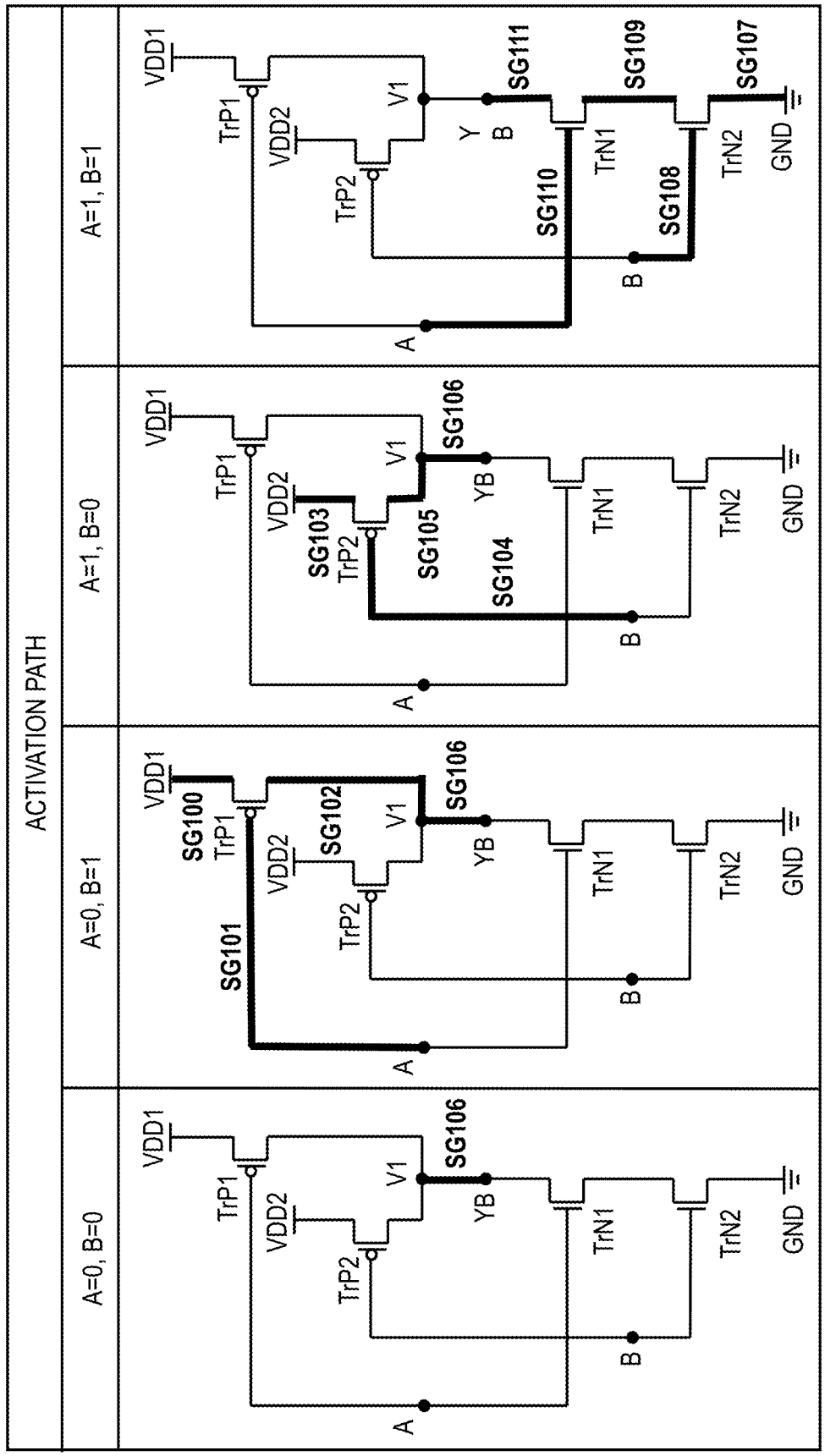
FIG. 11 is a circuit diagram showing activation paths of the 2-input NAND cell.

Here, using FIGS. 11 and 12, a specific example of the processing of calculating the activation path will be described. FIG. 11 is a circuit diagram showing the activation path of the 2-input NAND cell of FIG. 5 for each input pattern. In FIG. 11, the segment on the activation path is clearly indicated by a thick line.

When the input pattern is A=0 and B=0, the segment SG106 and the via V1 are calculated as components that affect the output value of the 2-input NAND cell if the failure is assumed, by referring to the result of the failure simulation, the segment connection information and the transistor connection information. Therefore, as shown in FIG. 11, the activation path when the input pattern is A=0 and B=0 is configured by the segment SG106 and the via V1.

Further, the activation paths are calculated in the same manner for the other input patterns. As shown in FIG. 11, the activation path when the input pattern is A=0 and B=1 is configured by the segments SG100, SG101, SG102 and SG106, the transistor TrP1, and the via V1. The activation path when the input pattern is A=1 and B=0 is configured by the segments SG103, SG104, SG105 and SG106, the transistor TrP2, and the via V1. The activation path when the input pattern is A=1 and B=1 is configured by the segments SG107, SG108, SG109, SG110 and SG110, and the transistors TrN1 and TrN2.

FIG. 12 is a table showing information on the activation paths of the 2-input NAND cell together with the numbers assigned in the order of closeness to the output terminal YB in the connection relationship. The path calculation unit 202 may manage the information of the calculated activation path according to the format shown in FIG. 12.

For example, the activation path when the input pattern is A=0 and B=0 includes the segment SG106 and the via V1. Since the segment SG106 is located closer to the output terminal YB than the via V1, the number from the output terminal YB is "1" in the segment SG106 and "2" in the via V1 as shown in FIG. 12.

Further, for example, the activation path when the input pattern is A=0 and B=1 includes the segments SG100 and SG101. As shown in FIG. 12, the number from the output terminal YB of the segments SG100 and SG101, respectively, are "5-1" and "5-2". Since the segments SG100 and SG101 are in the same level in the connection relationship from the output terminal YB, the branch numbers ("-1" and "-2") are used.

The path calculation unit 202 stores the information on the calculated activation path in the information storage unit 201 as the path information. The path calculation unit 202 may store various pieces of information calculated by performing the processing in the steps SP101 to SP104 in the information storage unit 201 as required.

Figure 13:
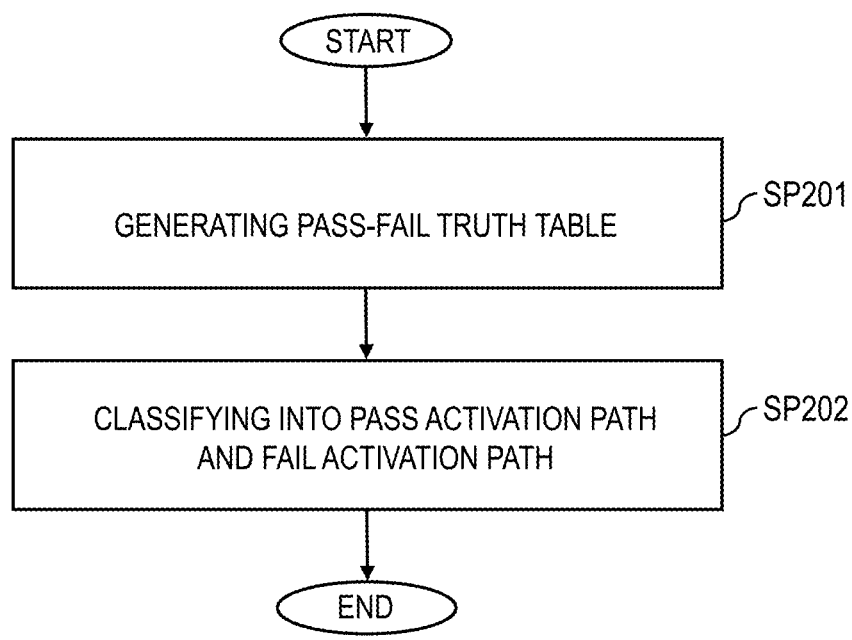
FIG. 13 is a flowchart showing an example of details of processing of classifying the activation path.

Next, the step SP200 of FIG. 3 will be described in detail. FIG. 13 is a flowchart showing an example of details of the processing of classifying the activation path (step SP200 of FIG. 3). As shown in FIG. 13, the processing of classifying the activation path is configured by two processing steps of steps SP201 and SP202.

First, in the step SP201, processing of generating truth values considering the pass/fail information is performed. Based on the pass/fail information, the path classification unit 203 generates a truth table considering the pass/fail information of the diagnosis target cell. Hereinafter, the truth table considering the pass/fail information is referred to as a pass/fail truth table.

FIG. 14 is a table showing an example of the pass/fail truth table of the 2-input NAND cell. In FIG. 14, it is assumed that pass/fail information indicates that a failure occurs in which the output value of the 2-input NAND cell becomes "0" at all times. As shown in FIG. 14, the pass/fail truth table includes, for each input pattern (the combination of the input values A and B), the expected value of the output value (the output expected value of the output terminal YB), the result of the test by LSI test apparatus and the pass/fail determination. The pass/fail determination is "pass" when the output expected value matches the result of the test, and "fail" when the output expected value does not match the result of the test.

Next, in the step SP202, processing of classifying into the pass activation path and the fail activation path is performed. The path classification unit 203 classifies the activation paths into the pass activation path and the fail activation path based on the pass/fail truth table.

Figure 15:
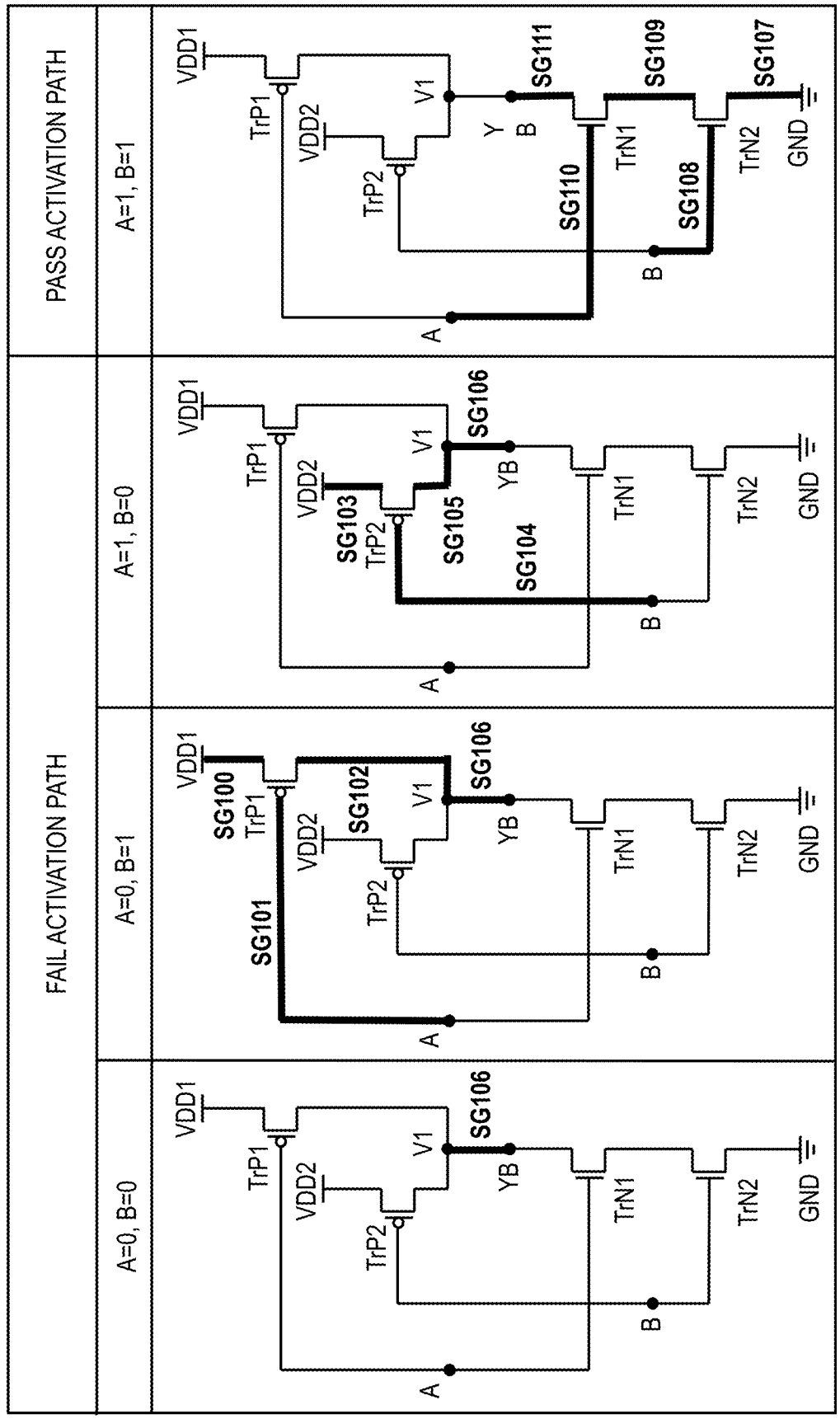
FIG. 15 is a diagram in which the activation paths of the 2-input NAND cell is classified into a pass activation path and a fail activation path.

FIG. 15 is a diagram in which the activation paths of the 2-input NAND cell shown in FIG. 11 is classified into the pass activation path and the fail activation path based on the pass/fail determination in the pass/fail truth table of FIG. 14. As shown in FIG. 15, the activation path when the input pattern is A=0 and B=0, the activation path when the input pattern is A=0 and B=1, and the activation path when the input pattern is A=1 and B=0 are classified into the fail activation path. The activation path when the input pattern is A=1 and B=1 is classified into the pass activation path.

The path classification unit 203 stores information on the classified activation path (pass activation path and fail activation path) in the information storage unit 201 as the path classification information. At this time, the path classification unit 203 may store the information of the pass activation path and the fail activation path in the information storage unit 201 in a format as shown in FIG. 12.

Figure 16:
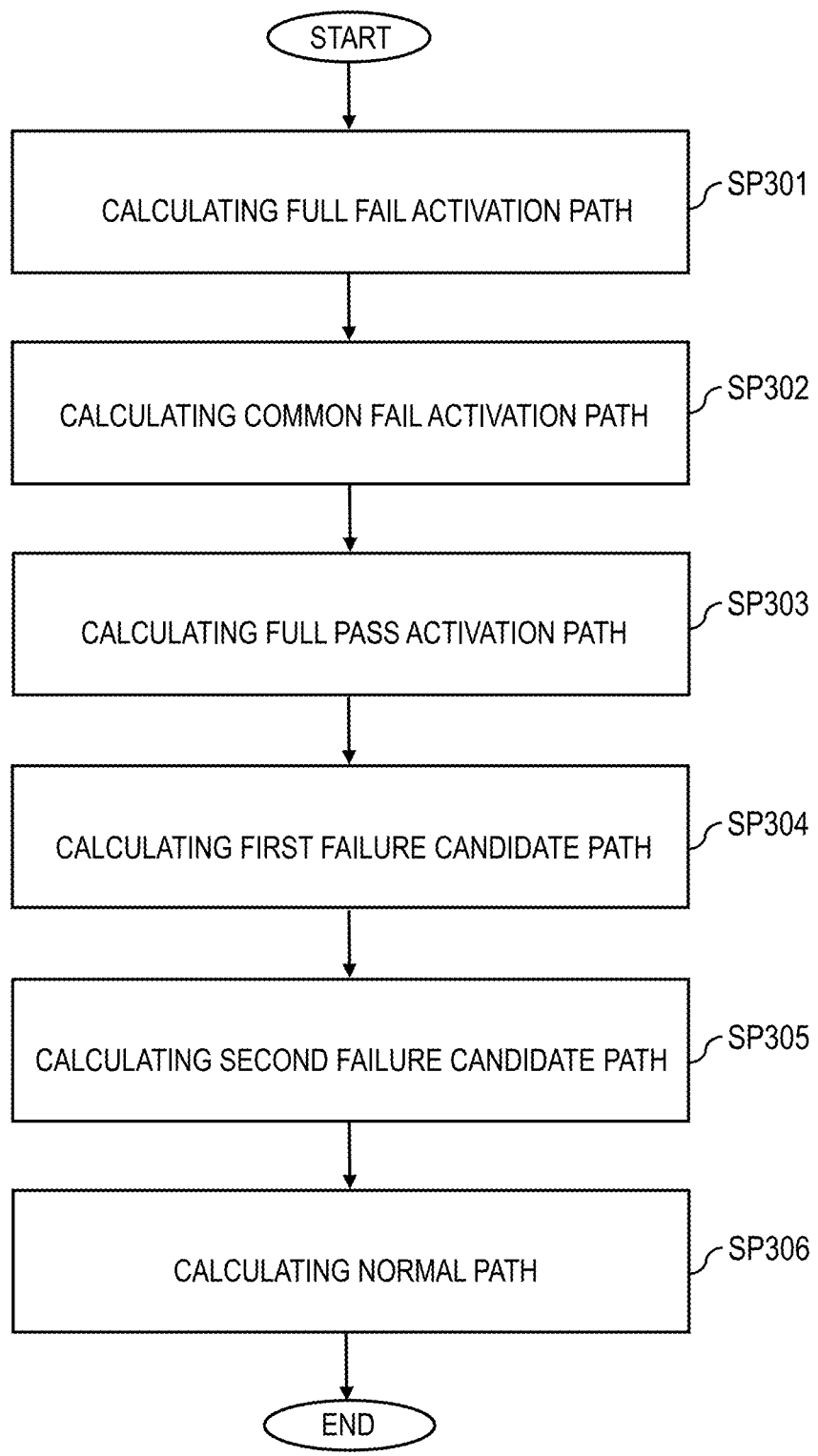
FIG. 16 is a flowchart showing an example of detailed of processing of calculating the first failure candidate path, the second failure candidate path, and a normal path.

Next, the step SP300 of FIG. 3 will be described in detail. FIG. 16 is a flowchart showing an example of detailed of the processing of calculating the first failure candidate path, the second failure candidate path, and the normal path (step SP300 of FIG. 3). As shown in FIG. 16, the processing of calculating the first failure candidate path, the second failure candidate path, and the normal path is configured by six processing steps of steps SP301 to SP306.

First, in the step SP301, processing of calculating the full fail activation path is performed. The path narrowing unit 204 refers to the information on the fail activation paths included in the path classification information, and calculates the path incorporating all the fail activation paths, that is, the full fail activation path. At this time, the path narrowing unit 204 calculates the full fail activation path by incorporating all the fail activation paths regardless of the input patterns to the diagnosis target cell.

Figure 17:
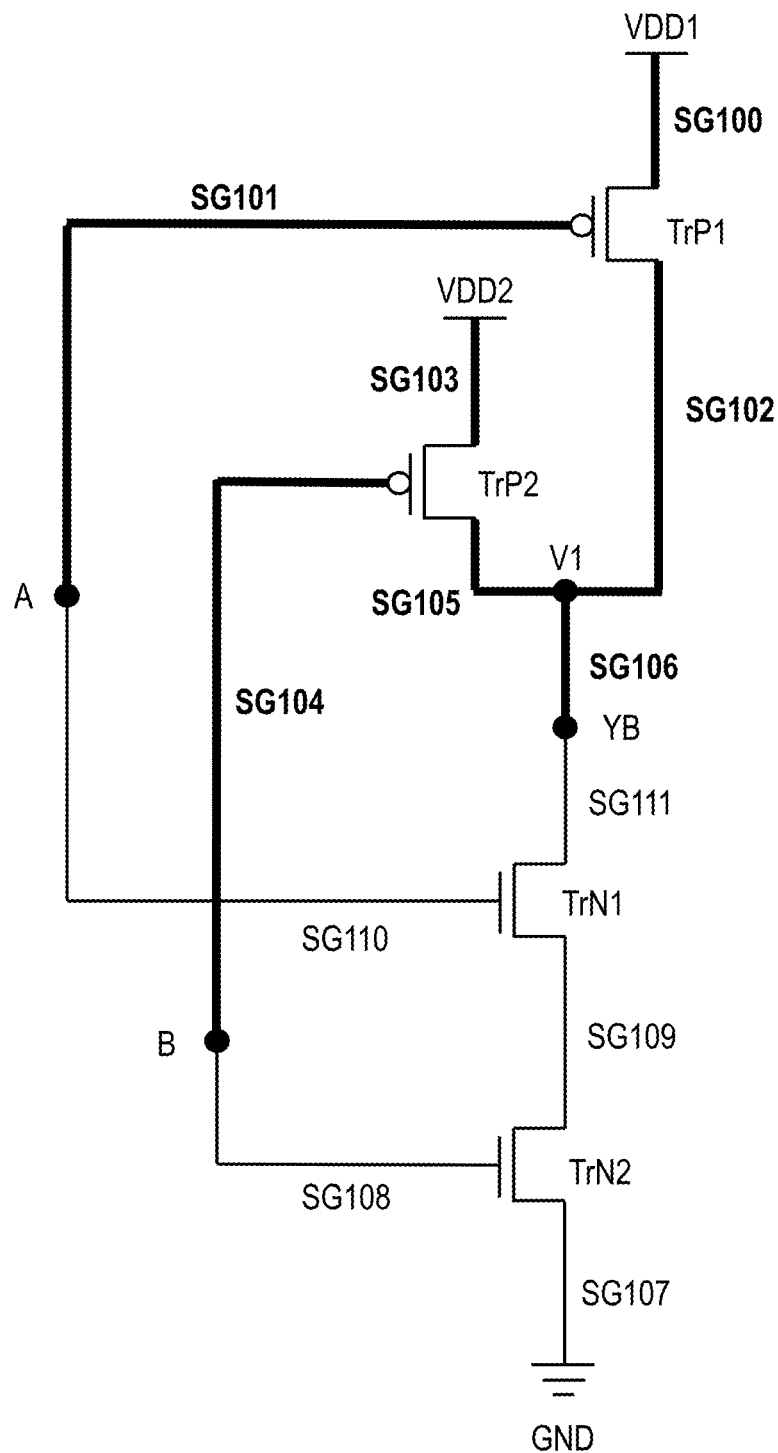
FIG. 17 is a circuit diagram showing a full fail activation path of the 2-input NAND cell.

FIG. 17 is a circuit diagram showing the full fail activation path of the 2-input NAND cell. The full fail activation path shown in FIG. 17 is configured as a path incorporating all the fail activation paths shown in FIG. 15. That is, the full fail activation path shown in FIG. 17 is configured as a path covering all the paths in the plurality of fail activation paths shown in FIG. 15 regardless of the input patterns to the 2-input NAND cell.

Next, in the step SP302, processing of calculating the common fail activation path is performed. The path narrowing unit 204 refers to the information on the fail activation paths included in the path classification information and calculates the path common to all the fail activation paths, that is, the common fail activation path. At this time, the path narrowing unit 204 calculates the path common to all the fail activation paths as the common fail activation path regardless of the input patterns to the diagnosis target cell.

Figure 18:
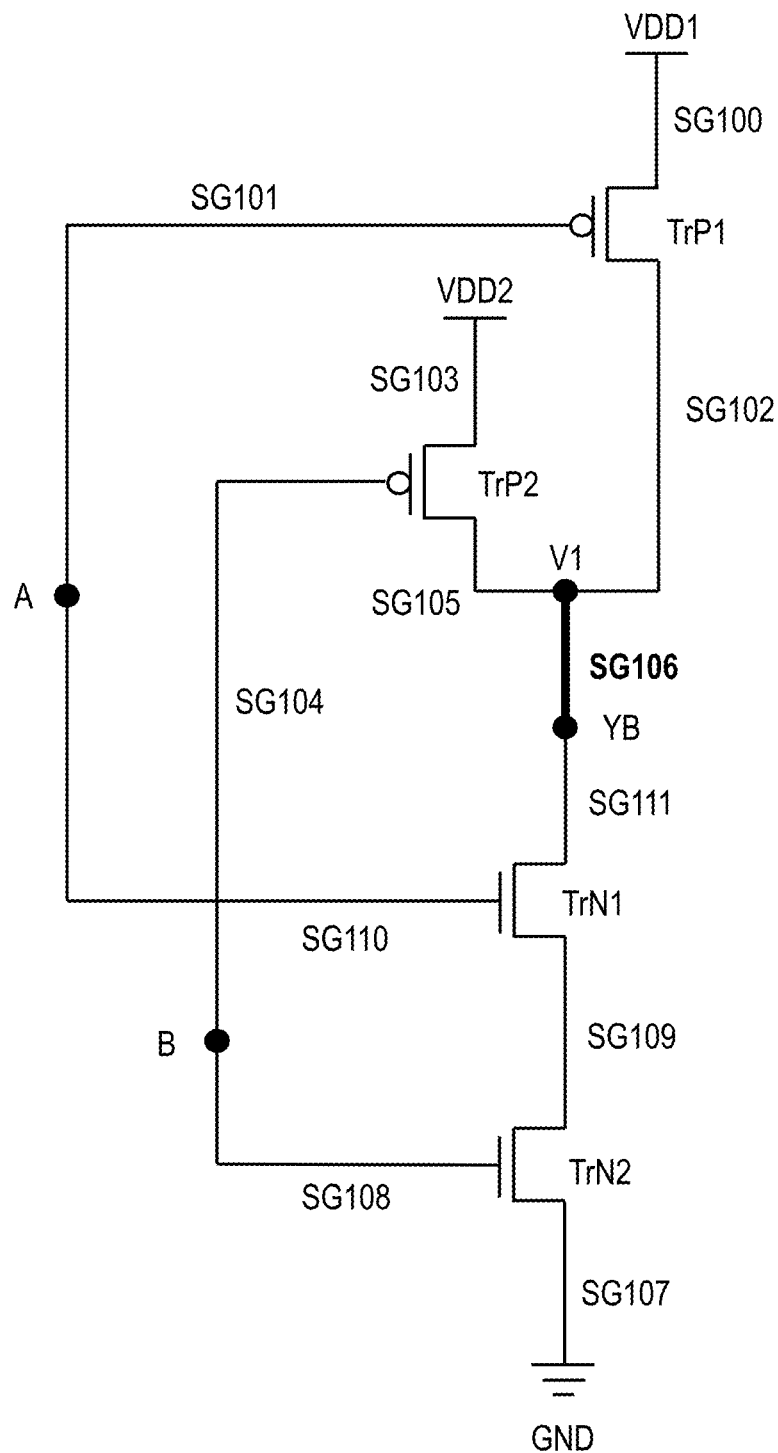
FIG. 18 is a circuit diagram showing a common fail activation path of the 2-input NAND cell.

FIG. 18 is a circuit diagram showing the common fail activation path of the 2-input NAND cell. The common fail activation path shown in FIG. 18 is configured as a path common to all the fail activation paths shown in FIG. 15. The components common to all the fail activation paths shown in FIG. 15 is the segment SG106 and the via V1. That is, the full fail activation path shown in FIG. 18 is configured by the segment SG106 and the via V1, as the path common to all the fail activation paths shown in FIG. 15, regardless of the input patterns to the 2-input NAND cell.

Next, in the step SP303, processing of calculating full pass activation path is performed. The path narrowing unit 204 refers to the information on the pass activation paths included in the path classification information, and calculates the path incorporating all the pass activation paths, that is, the full pass activation path. At this time, the path narrowing unit 204 calculates the full pass activation path by incorporating all the pass activation paths regardless of the input patterns to the diagnosis target cell.

Figure 19:
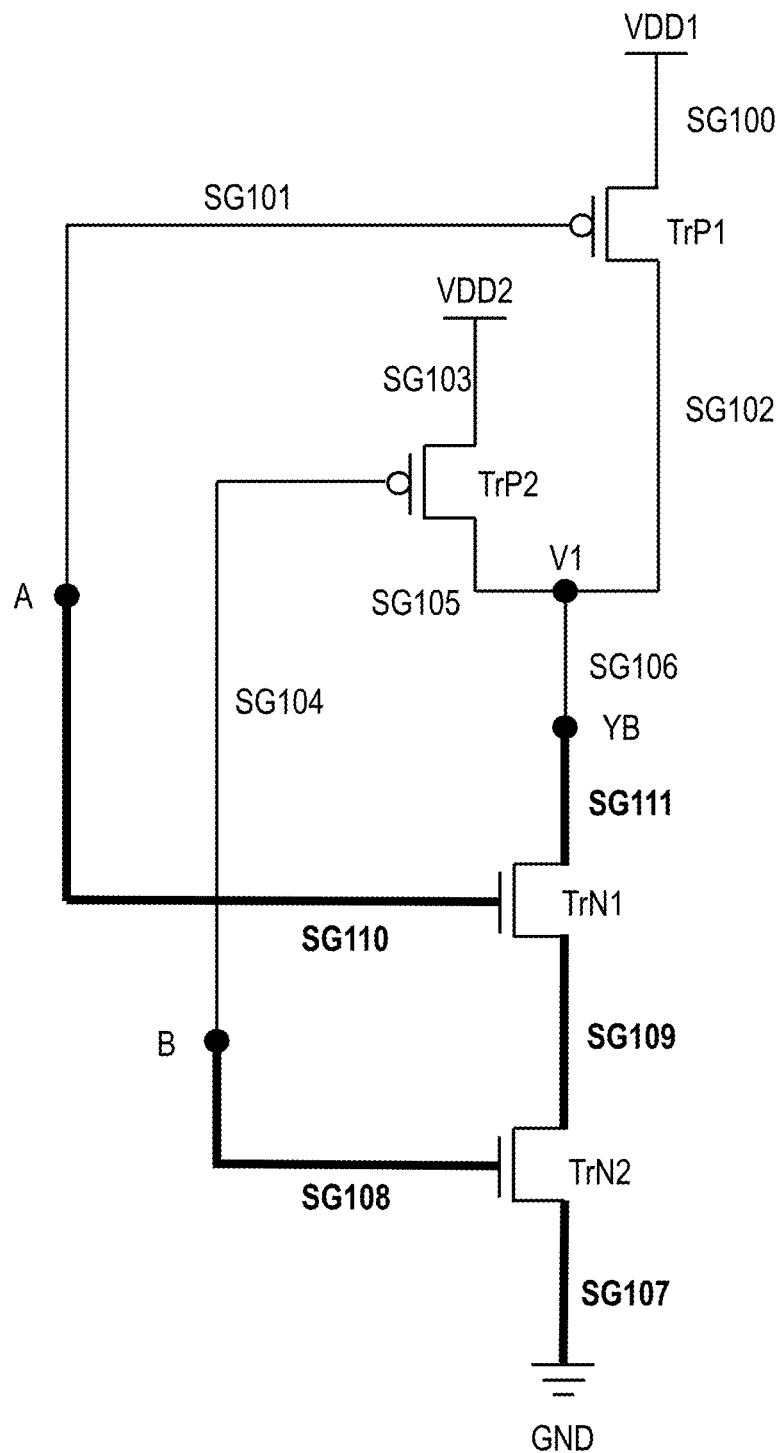
FIG. 19 is a circuit diagram showing a full pass activation path of the 2-input NAND cell.

FIG. 19 is a circuit diagram showing the full pass activation path of the 2-input NAND cell. The full pass activation path shown in FIG. 19 is configured as a path incorporating all the pass activation paths shown in FIG. 15. In FIG. 15, since the pass activation path is configured by only the activation path when the input pattern is A=1 and B=1, the full pass activation path shown in FIG. 19 is the same as the pass activation path shown in FIG. 15. If there is a plurality of pass activation paths in FIG. 15, the full pass activation path shown in FIG. 19 is configured as a path covering all the paths in the plurality of pass activation paths shown in FIG. 15 regardless of the input patterns to the 2-input NAND cell.

Next, in the step SP304, processing of calculating the first failure candidate path is performed. Specifically, the path narrowing unit 204 performs processing of removing the full pass activation path from the common fail activation path, that is, the first removal processing. The path narrowing unit 204 calculates a path left by the first removal processing as the first failure candidate path. In addition, the path narrowing unit 204 stores the calculated first failure candidate path in the information storage unit 201 as the path narrowing information.

Figure 20:
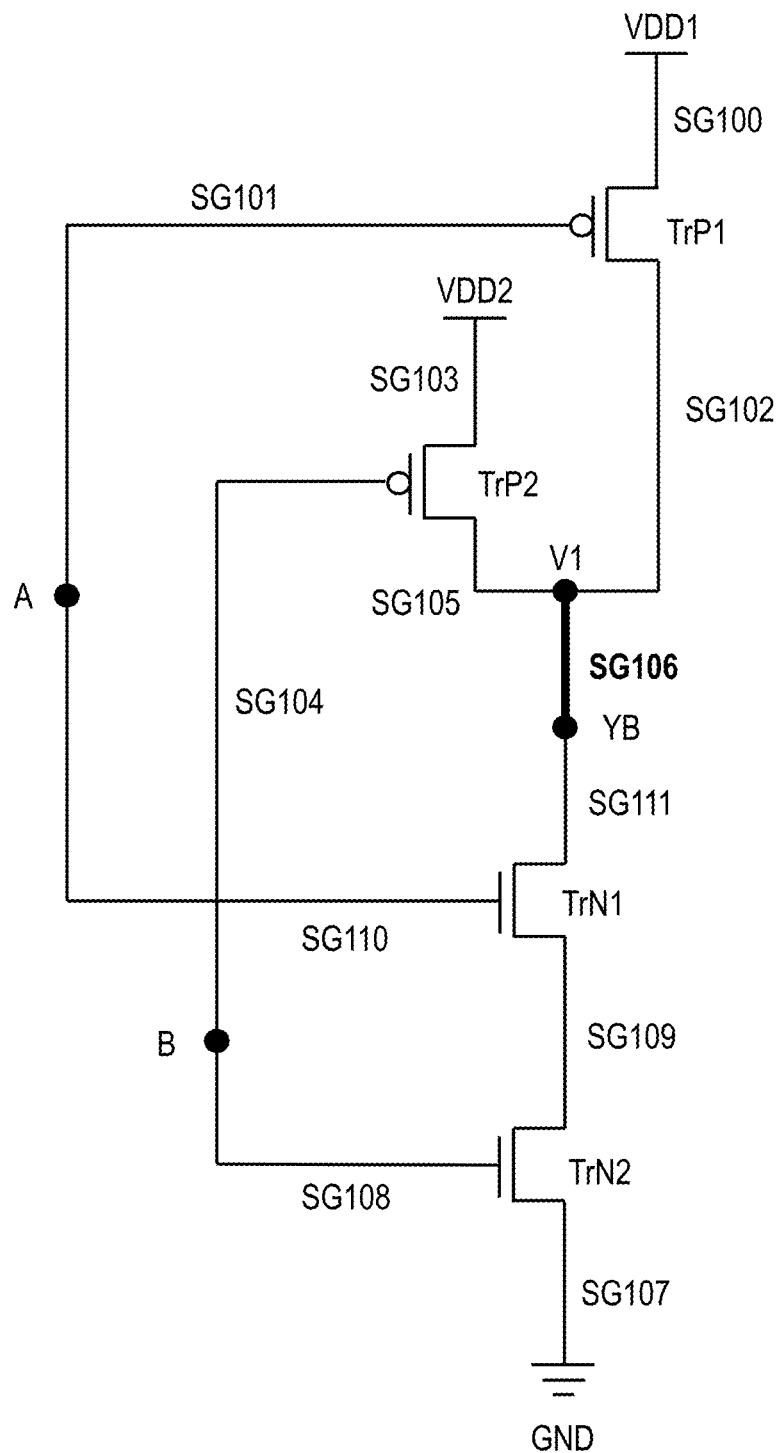
FIG. 20 is a circuit diagram showing the first failure candidate path of the 2-input NAND cell.

FIG. 20 is a circuit diagram showing the first failure candidate path of the 2-input NAND cell. The first failure candidate path shown in FIG. 20 is a path calculated by removing the full pass activation path shown in FIG. 19 from the common fail activation path shown in FIG. 18. In the examples of FIGS. 18 and 19, since there is no component common to each other, the first failure candidate path shown in FIG. 20 is the same as the common fail activation path shown in FIG. 18.

Next, in the step SP305, processing of calculating the second failure candidate path is performed. Specifically, the path narrowing unit 204 performs processing of removing the first failure candidate path from the full fail activation path, that is, the second removal processing. The path narrowing unit 204 calculates a path left by the second removal processing as the second failure candidate path. In addition, the path narrowing unit 204 stores the calculated second failure candidate path in the information storage unit 201 as the path narrowing information.

Figure 21:
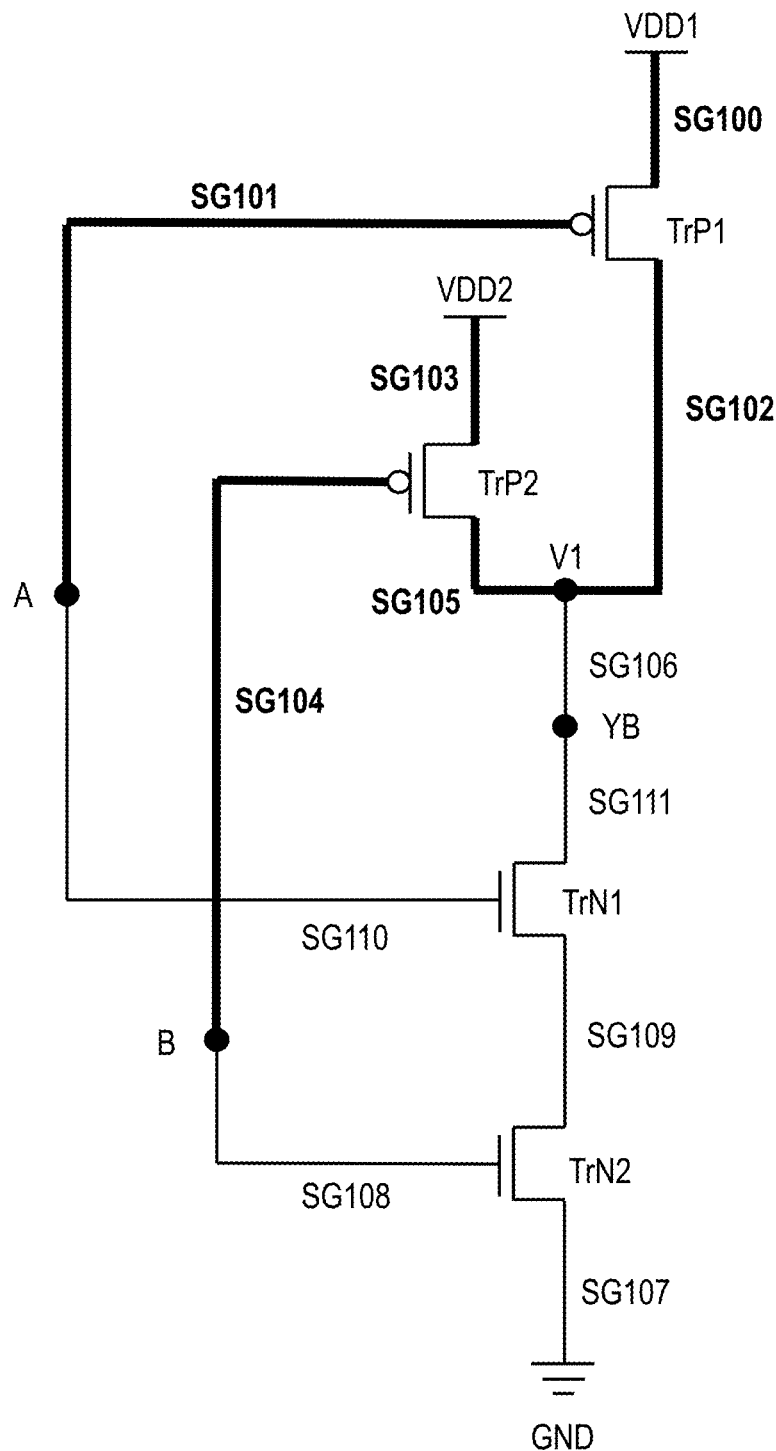
FIG. 21 is a circuit diagram showing the second failure candidate path of the 2-input NAND cell.

FIG. 21 is a circuit diagram showing the second failure candidate path of the 2-input NAND cell. The second failure candidate path shown in FIG. 21 is a path calculated by removing the first failure candidate path shown in FIG. 20 from the full fail activation path shown in FIG. 17.

Next, in the step SP306, processing of calculating the normal path is performed. Specifically, the path narrowing unit 204 performs processing of removing the first failure candidate path and the second failure candidate path from the full pass activation path, that is, the third removal processing. The path narrowing unit 204 calculates a path left by the third removal processing as the normal path. In addition, the path narrowing unit 204 stores the calculated normal path in the information storage unit 201 as the path narrowing information.

Figure 22:
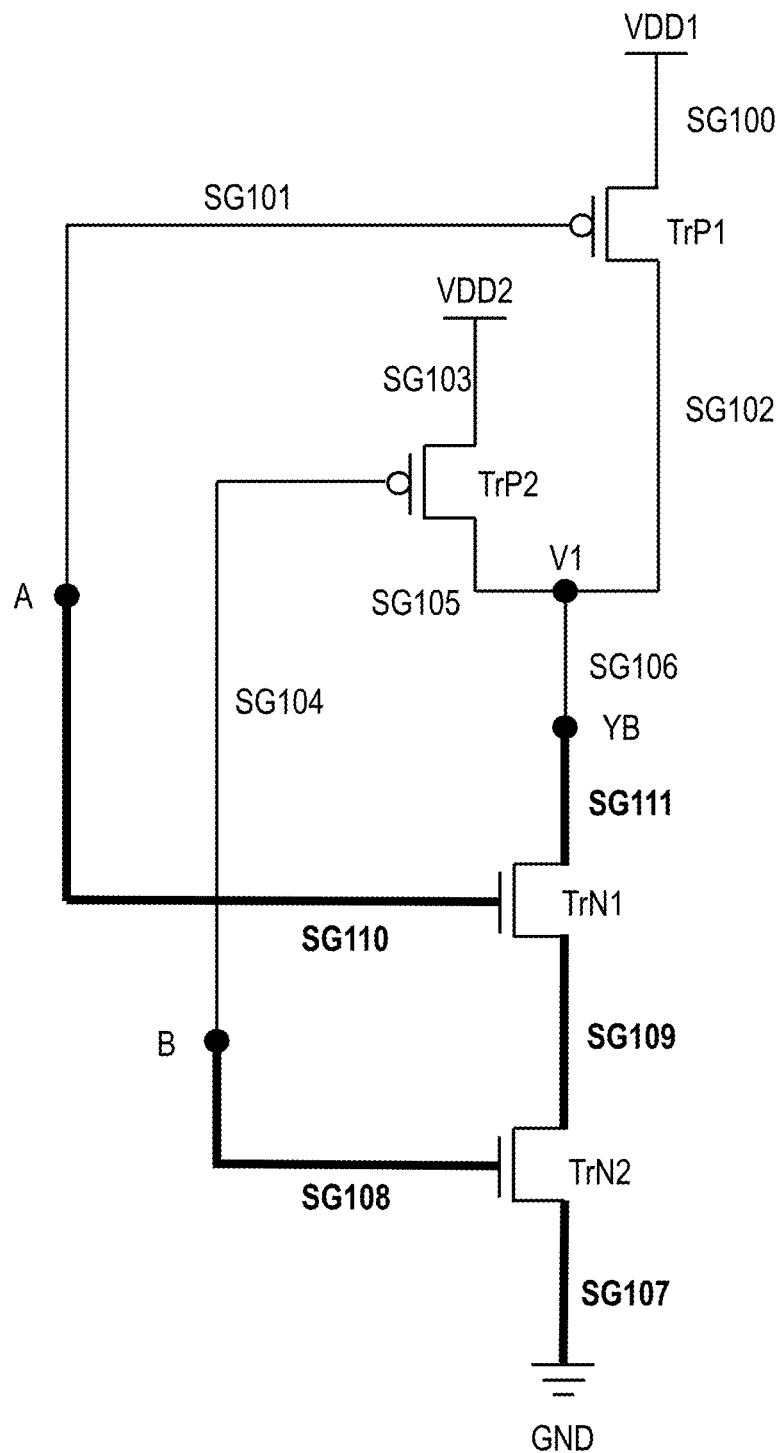
FIG. 22 is a circuit diagram showing the normal path of the 2-input NAND cell.

FIG. 22 is a circuit diagram showing the normal path of the 2-input NAND cell. The normal path shown in FIG. 22 is a path calculated by removing the first failure candidate path shown in FIG. 20 and the second failure candidate path shown in FIG. 21 from the full pass activation path shown in FIG. 19. In the examples of FIGS. 19 to 21, since there is no common component among the full pass activation path, the first failure candidate path, and the second failure candidate path, the normal path shown in FIG. 22 is the same as the full pass activation path shown in FIG. 19.

The path narrowing unit 204 may store the information on the first failure candidate path, the second failure candidate path, and the normal path in the information storage unit 201 in a format as shown in FIG. 12.

Figure 23:
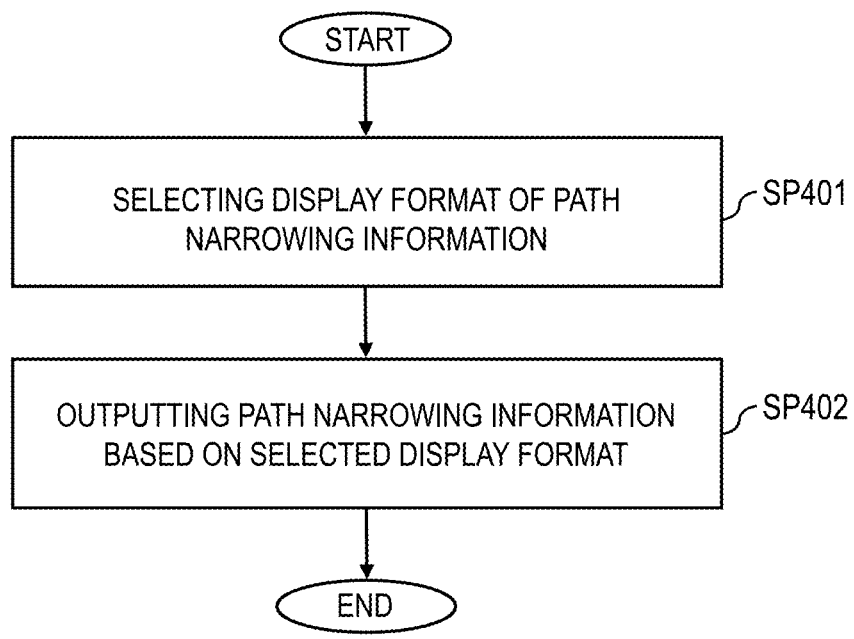
FIG. 23 is a flowchart showing an example of detailed of processing of outputting path narrowing information.

Next, the step SP400 of FIG. 3 will be described in detail. FIG. 23 is a flowchart showing an example of detailed of the processing of outputting the path narrowing information (step SP400 of FIG. 3). As shown in FIG. 23, the processing of outputting the path narrowing information is configured by two processing steps of steps SP401 and SP402.

First, in the step SP401, processing of selecting a display format of the path narrowing information is performed. The result output unit 205 selects the display format of the path narrowing information based on information for selecting the display format of the path narrowing information. For example, the information for selecting the display format of the path narrowing information is information provided to the failure diagnostic apparatus 110 by the analyst through the input/output device 130.

The failure diagnostic apparatus 110 can visually display the path narrowing information in the layout format of the diagnosis target cell on a display of the input/output device 130. On the other hand, the failure diagnostic apparatus 110 can also output the path narrowing information as character information, for example, in the format shown in FIG. 12 to a printer of the input/output device 130. The result output unit 205 selects such a display format of the path narrowing information.

When the result output unit 205 selects to visually display the path narrowing information, for example, the display format of the path narrowing information can be set so that the first failure candidate path, the second failure candidate path, and the normal path are highlighted in different colors. The result output unit 205 can also set the display format of the path narrowing information so as to highlight the components such as the segments included in the first failure candidate path or the second failure candidate path together with the numbers from the output terminal YB shown in FIG. 12.

Next, in the step SP402, processing of outputting the path narrowing information based on the selected display format is performed. The result output unit 205 outputs the path narrowing information based on the selected display format of the path narrowing information. For example, when the path narrowing information is displayed on the display together with the layout of the diagnosis target cell, the result output unit 205 outputs, as the path narrowing information, the in-cell coordinate information of the components such as the segments included in the first failure candidate path, the second failure candidate path, and the normal path together with the layout information of the diagnosis target cell. The output path narrowing information is sent to the input/output device 130, and is provided to the analyst through the display, the printer, or the like.

Figure 24:
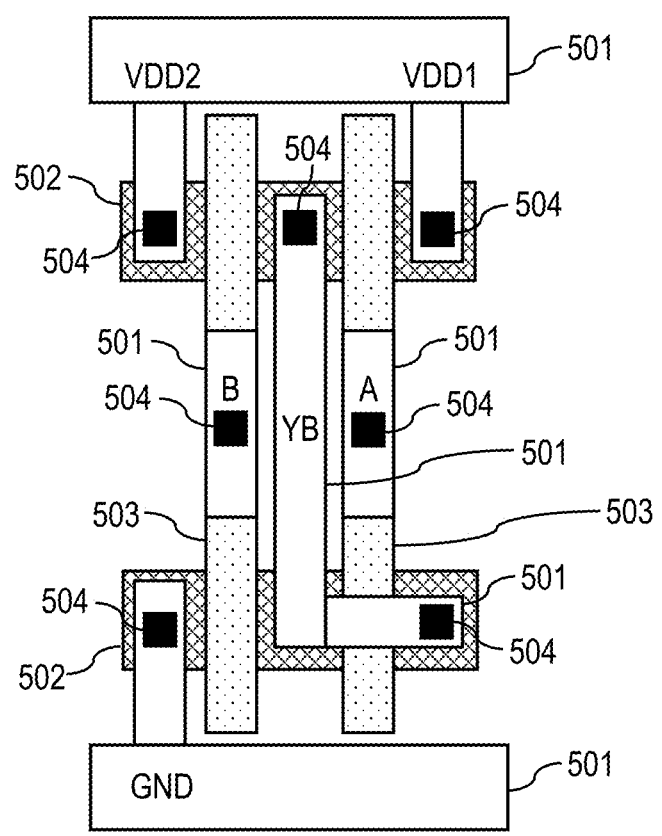
FIG. 24 is an exemplary layout diagram of the 2-input NAND cell.

Here, some examples of displaying the path narrowing information visually will be described. FIG. 24 is an exemplary layout diagram of the 2-input NAND cell. As shown in FIG. 24, the layout of the 2-input NAND cell is configured by wiring layers 501, diffusion layers 502, polysilicon layers 503, and contact portions 504.

Figure 25:
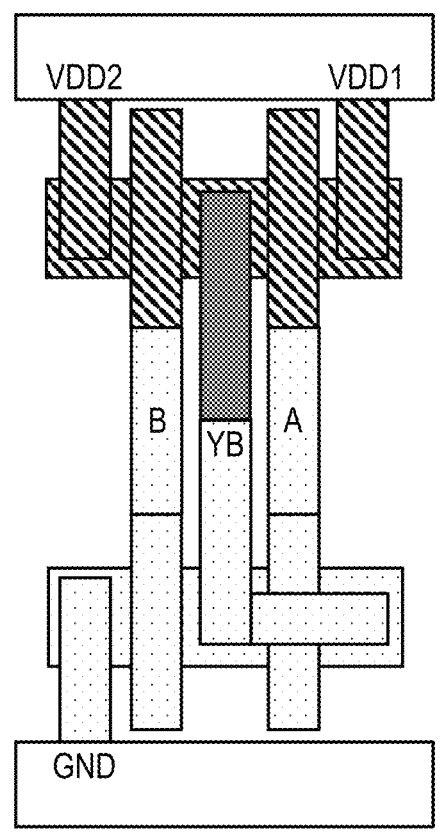
FIG. 25 is an exemplary layout diagram visually displaying the path narrowing information on a layout of the 2-input NAND cell.

FIG. 25 is an exemplary layout diagram visually displaying the path narrowing information on the layout of the 2-input NAND cell shown in FIG. 24. As shown in FIG. 25, the first failure candidate path is highlighted by a coloring pattern. The second failure candidate path is highlighted by a hatching pattern of oblique lines. The normal path is highlighted by a satin finish pattern. Since the analyst can visually obtain the result of the failure diagnosis, it is possible to improve the efficiency of the investigation of the failure analysis.

Figure 26:
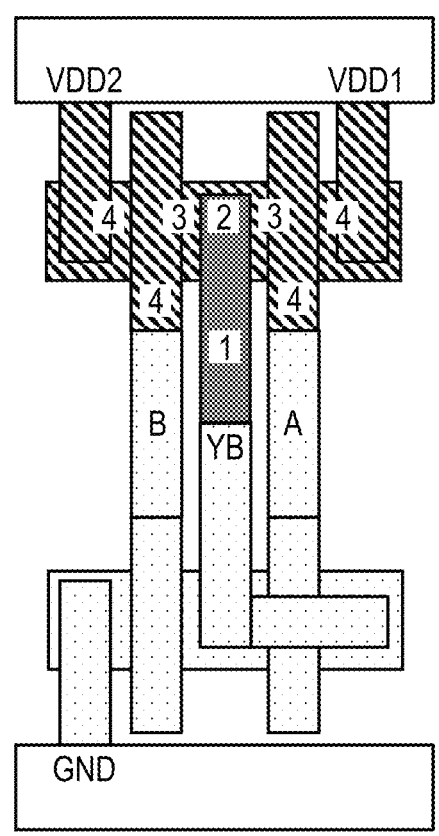
FIG. 26 is another exemplary layout diagram visually displaying the path narrowing information on the layout of the 2-input NAND cell.

Further, FIG. 26 is another exemplary layout diagram visually displaying the path narrowing information on the layout of the 2-input NAND cell. As shown in FIG. 26, in addition to the highlighting by the three types of patterns as shown in FIG. 25, numbers indicating the priority order of the failure analysis are assigned to corresponding components (segments and vias) on the layout. In FIG. 26, the numbers are assigned in the order of the closeness to the output terminal YB. As a result, it is possible to improve the efficiency of the investigation for the analyst to prioritize a plurality of analysis locations.

As described above, the failure diagnostic apparatus according to the first embodiment outputs the first failure candidate path, the second failure candidate path, and the normal path of the diagnosis target cell. The first failure candidate path is a path obtained by removing the full pass activation path from the common fail activation path. That is, the first failure candidate path is configured based on a path that is shared by all the activation paths that become "fail". Therefore, the first failure candidate path is a failure location candidate having a high rate of agreement with the simulation condition of the failure diagnosis. In other words, the first failure candidate path is a failure location candidate having a high degree of accuracy.

On the other hand, the second failure candidate path is a path obtained by removing the first failure candidate path from the full fail activation path. That is, the second failure candidate path is configured based on a path obtained by removing a path common to all the activation paths that become "fail" from a path that incorporates all the activation paths that become "Fail". Therefore, the second failure candidate path is a failure location candidate where the agreement rate to the simulation condition of the failure diagnosis is not higher than the first failure candidate path. In other words, the second failure candidate path is a failure location candidate having a low degree of accuracy.

Further, the normal path is a path obtained by removing the first failure candidate path and the second failure candidate path from the full pass activation path. That is, the normal path is a path in which there is no possibility of failure. Therefore, the normal path is a path that does not require physical analysis.

As described above, the failure diagnostic apparatus according to the first embodiment provides not only the information on the first failure candidate path, which is a failure location candidate having a high degree of accuracy, but also the information on the second failure candidate path, which is a failure location candidate with a low degree of accuracy, and the information on the normal path, which does not require physical analysis, to the analyst. Based on the information on the second failure candidate path and the normal path, the analyst can efficiently investigate whether a failure exists in a region other than the failure location candidate having a high degree of accuracy.

In the above description, the activation path does not include an input terminal and an output terminal. However, the input terminal and the output terminal may be included in the activation path. In this case, the information on the input terminal and the output terminal is included in any of the first failure candidate path, the second failure candidate path, and the normal path.

Second Embodiment

Next, the second embodiment will be described. A failure diagnostic apparatus according to the second embodiment differs from the failure diagnostic apparatus according to the first embodiment in that it includes an output determination unit for determining whether to output the path information and the path classification information.

Figure 27:
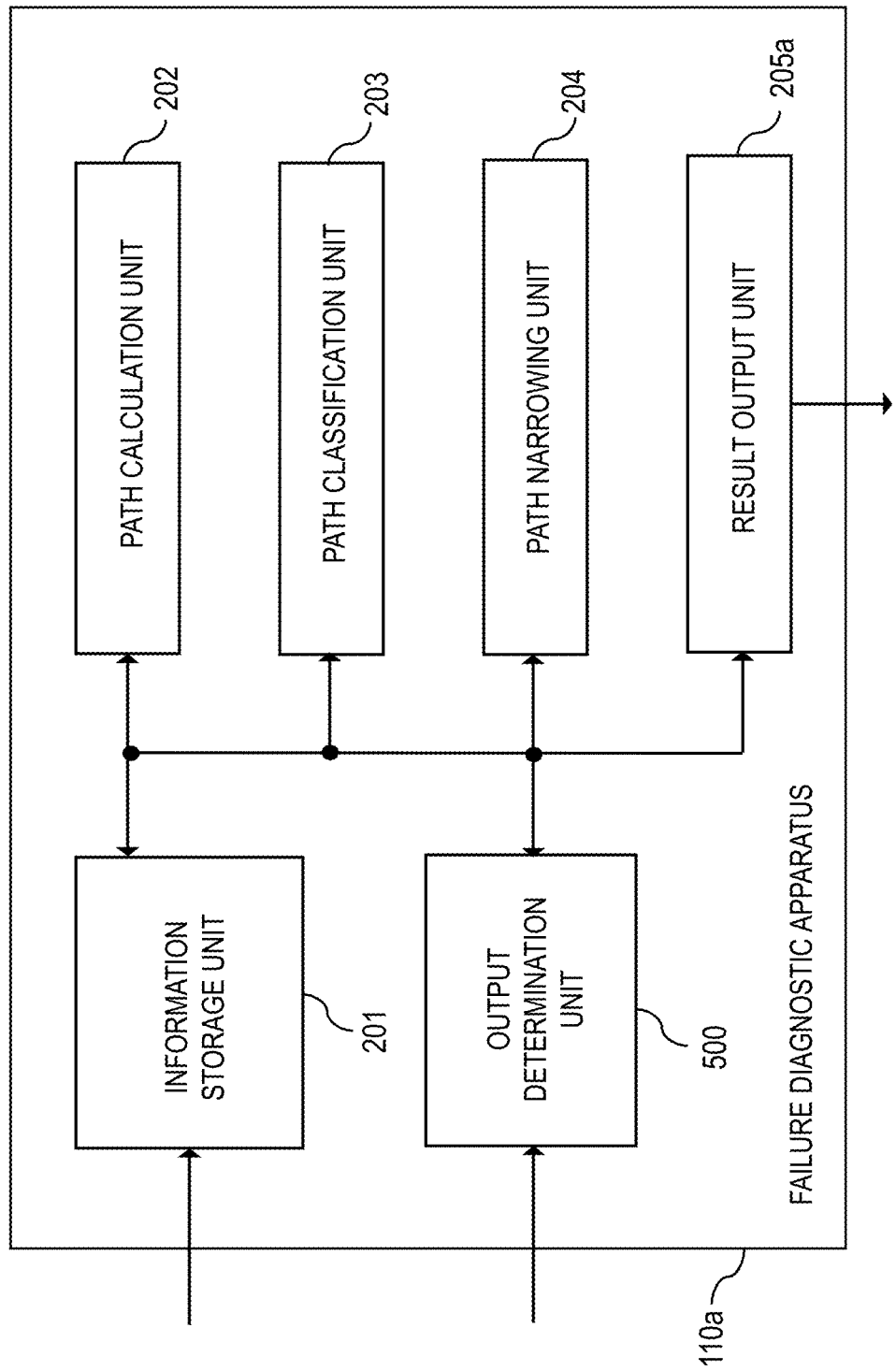
FIG. 27 is a block diagram showing an example of functional blocks of a failure diagnostic apparatus according to the second embodiment.

FIG. 27 is a block diagram showing an example of functional blocks of a failure diagnostic apparatus 110a according to the second embodiment. As shown in FIG. 27, in the failure diagnostic apparatus 110a, the result output unit 205 of the failure diagnostic apparatus 110 shown in FIG. 2 is changed to a result output unit 205a. In addition to the configuration of the failure diagnostic apparatus 110 shown in FIG. 2, the failure diagnostic apparatus 110a includes an output determination unit 500.

The output determination unit 500 is connected to the information storage unit 201 and the result output unit 205a. The output determination unit 500 receives, from the input/output device 130, the first determination information for determining whether to output the path information, and the second determination information for determining whether to output the path classification information. These pieces of information are, for example, information provided by the analysis.

When receiving the first determination information indicating that the path information is to be output, the output determination unit 500 determines to output the path information, and outputs the first output control signal for instructing output of the path information to the result output unit 205a. Further, when receiving the second determination information indicating that the path classification information is to be output, the output determination unit 500 determines to output the path classification information, and outputs the second output control signal for instructing output of the path classification information to the result output unit 205a.

When receiving the first output control signal from the output determination unit 500, the result output unit 205a reads the path information from the information storage unit 201 and outputs the path information to the input/output device 130. Further, when receiving the second output control signal from the output determination unit 500, the result output unit 205a reads the path classification information from the information storage unit 201, and outputs the path classification information to the input/output device 130.

According to the second embodiment, the analyst can obtain the path information and the path classification information through an output device such as a display or a printer. As a result, the analyst can improve the efficiency of the investigation of the failure analysis.

Although the invention made by the present inventor has been specifically described based on the embodiments, the present invention is not limited to the embodiments described above, and it is needless to say that various modifications can be made without departing from the gist thereof.

What is claimed is:

1. A failure diagnostic apparatus for diagnosing a failure location of a cell which is a basic circuit realizing a basic logical operation and included in an integrated circuit, the failure diagnosis apparatus comprising:
    a path calculation unit configured to calculate, for each input pattern to a diagnosis target cell, a path affecting an output value of the diagnosis target cell when a failure is assumed as an activation path based on circuit connection information indicating a connection relationship between components included in the diagnosis target cell and expected value information which is pattern information of input and output signals for confirming an operation of the diagnosis target cell;
    a path classification unit configured to classify, based on pass/fail information including a result of a test to the diagnosis target cell indicated by a pass or fail for each input pattern, the activation path associated with the input pattern for which the diagnosis target cell has passed the test as a pass activation path, and the activation path associated with the input pattern for which the diagnosis target cell has failed the test as a fail activation path;
    a path narrowing unit configured to calculate a first failure candidate path, a second failure candidate path and a normal path of the diagnosis target cell; and
    a result output unit configured to output information on the first failure candidate path, the second failure candidate path and the normal path,
    wherein the path narrowing unit is configured to:
        calculate, regardless of the input patterns, a path incorporating all the fail activation paths as a full fail activation path;
        calculate, regardless of the input patterns, a path common to all the fail activation paths as a common fail activation path;
        calculate, regardless of the input patterns, a path incorporating all the pass activation paths as a full pass activation path;
        perform, as first removal processing, processing of removing the full pass activation path from the common fail activation path to calculate, as the first failure candidate path, a path left by the first removal processing;
        perform, as second removal processing, processing of removing the first failure candidate path from the full fail activation path to calculate, as the second failure candidate path, a path left by the second removal processing; and
        perform, as third removal processing, processing of removing the first failure candidate path and the second failure candidate path from the full pass activation path to calculate, as the normal path, a path left by the third removal processing.

2. The failure diagnostic apparatus according to claim 1, wherein the components include a transistor, a terminal, a via and a segment,
    wherein the segment is a component for connecting between any two of the transistor, the terminal and the via, and
    wherein the path calculation unit is configured to:
        calculate, for each input pattern, a path by which the input pattern determines the output value of the diagnosis target cell as a TrON path;
        execute a failure simulation assuming a failure of the segment included in the TrON path to calculate information on whether the segment affects the output value of the diagnosis target cell when the failure is assumed; and
        calculate the activation path based on the information on whether the segment affects the output value of the diagnosis target cell.

3. The failure diagnostic apparatus according to claim 2, wherein the path calculation unit is configured to:
    analyze the connection relationship between the components of the diagnosis target cell based on the circuit connection information to extract information on a connection relationship between the segments and components other than the segments as segment connection information, and information on a connection relationship between nodes of the transistors and the segments as transistor information;
    execute a logic simulation for the diagnosis target cell based on the circuit connection information, the expected value information and the transistor connection information;
    calculate, for each input pattern, a state value of the segment based on a result of the logic simulation to identify a conduction state or non-conduction state of each transistor;
    refer to the identified conduction state or non-conduction state of each transistor to extract the transistor of the conduction state as a transistor for determining an output state of the diagnosis target cell; and
    calculate the TrON path based on the extracted transistor of the conduction state and the transistor connection information.

4. The failure diagnostic apparatus according to claim 1, wherein the result of the test is a result obtained by performing a test of the integrated circuit using a test apparatus.

5. The failure diagnostic apparatus according to claim 1, wherein the path calculation unit is configured to receive diagnosis target cell information including information for identifying the diagnosis target cell.

6. The failure diagnostic apparatus according to claim 1, wherein the result output unit is configured to:
    receive layout information of the diagnosis target cell, and circuit coordinate information including in-cell coordinate information of the components of the diagnosis target cell;
    select a display format of the information on the first failure candidate path, the second failure candidate path and the normal path based on information for selecting the display format of the information on the first failure candidate path, the second failure candidate path and the normal path; and output the layout information of the diagnosis target cell, and the in-cell coordinate information of the components included in the first failure candidate path, the second failure candidate path and the normal path based on the selected display format.

7. The failure diagnostic apparatus according to claim 1, further comprising an output determination unit configured to output a first output control signal and a second output control signal to the result output unit,
wherein the output determination unit is configured to:
receive first determination information for determining whether to output information on the activation path;
output the first output control signal for instructing an output of the information on the activation path to the result output unit when receiving the first determination information indicating that the information on the activation path is to be output;
receive second determination information for determining whether to output information on the pass activation path and the fail activation path; and
output the second output control signal for instructing an output of the information on the pass activation path and the fail activation path to the result output unit when receiving the second determination information indicating that the information on the pass activation path and the fail activation path is to be output,
wherein the result output unit is configured to:
output the information on the activation path based on the first output control signal; and
output the information on the pass activation path and the fail activation path based on the second output control signal.

8. A failure diagnostic method for diagnosing a failure location of a cell which is a basic circuit realizing a basic logical operation and included in an integrated circuit, the failure diagnostic method comprising:
reading, from a memory, circuit connection information indicating a connection relationship between components included in a diagnosis target cell, expected value information which is pattern information of input and output signals for confirming an operation of the diagnosis target cell, and pass/fail information including a result of a test to the diagnosis target cell indicated by a pass or fail for each input pattern;
calculating calculate, for each input pattern, a path affecting an output value of the diagnosis target cell when a failure is assumed as an activation path based on the circuit connection information and the expected value information;
classifying, based on the pass/fail information, the activation path associated with the input pattern for which the diagnosis target cell has passed the test as a pass activation path, and the activation path associated with the input pattern for which the diagnosis target cell has failed the test as a fail activation path;
calculating a first failure candidate path, a second failure candidate path and a normal path of the diagnosis target cell; and
outputting information on the first failure candidate path, the second failure candidate path and the normal path,
wherein the calculating of the first failure candidate path, the second failure candidate path and the normal path of the diagnosis target cell includes:
calculating, regardless of the input patterns, a pat incorporating all the fail activation paths as a full fail activation path;
calculating, regardless of the input patterns, a path common to all the fail activation paths as a common fail activation path;
calculating, regardless of the input patterns, a path incorporating all the pass activation paths as a full pass activation path;
performing, as first removal processing, processing of removing the full pass activation path from the common fail activation path to calculate, as the first failure candidate path, a path left by the first removal processing;
performing, as second removal processing, processing of removing the first failure candidate path from the full fail activation path to calculate, as the second failure candidate path, a path left by the second removal processing; and
performing, as third removal processing, processing of removing the first failure candidate path and the second failure candidate path from the full pass activation path to calculate, as the normal path, a path left by the third removal processing.

* * * * *